(12) United States Patent
Bai et al.

(10) Patent No.: US 12,089,480 B2
(45) Date of Patent: Sep. 10, 2024

(54) DISPLAY PANEL INCLUDING REDUNDANT DRIVING CIRCUITS THAT FORM ALIGNMENT MARKS IN A PERIPHERAL REGION THEREOF, METHOD FOR MANUFACTURING THE SAME, DISPLAY DEVICE AND METHOD FOR MANUFACTURING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lu Bai, Beijing (CN); Pengfei Yu, Beijing (CN); Jie Dai, Beijing (CN); Shun Zhang, Beijing (CN); Huijuan Yang, Beijing (CN); Xiaofeng Jiang, Beijing (CN); Xin Zhang, Beijing (CN); Meng Zhang, Beijing (CN); Yi Qu, Beijing (CN); Mengqi Wang, Beijing (CN); Hao Zhang, Beijing (CN); Siyu Wang, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

(*) Notice: Subject to any disclaimer, the term of this patent is extended or adjusted under 35 U.S.C. 154(b) by 752 days.

(21) Appl. No.: 17/280,016

(22) PCT Filed: May 9, 2020

(86) PCT No.: PCT/CN2020/089362
§ 371 (c)(1),
(2) Date: Mar. 25, 2021

(87) PCT Pub. No.: WO2021/226744
PCT Pub. Date: Nov. 18, 2021

(65) Prior Publication Data
US 2022/0045140 A1    Feb. 10, 2022

(51) Int. Cl.
*H10K 59/88*    (2023.01)
*H01L 23/544*    (2006.01)
(Continued)

(52) U.S. Cl.
CPC ............ *H10K 59/88* (2023.02); *H01L 23/544* (2013.01); *H10K 50/841* (2023.02); *H10K 50/87* (2023.02);
(Continued)

(58) Field of Classification Search
CPC ............ H10K 59/1201; H10K 59/1216; H10K 59/131; H10K 59/88; H10K 50/841;
(Continued)

(56) References Cited

U.S. PATENT DOCUMENTS

2004/0263086 A1* 12/2004 Maede ................. G09G 3/3283
                                                                   315/169.3
2005/0236620 A1* 10/2005 Yamada ............... H10K 71/191
                                                                       257/59
(Continued)

FOREIGN PATENT DOCUMENTS

CN    104091808 A    10/2014
CN    107315501 A    11/2017
(Continued)

OTHER PUBLICATIONS

Oxford English Dictionary, s.v. "'to fill up' in fill (v.), sense 2," Dec. 2023, https://doi.org/10.1093/OED/3288873692. (Year: 2023).*
(Continued)

*Primary Examiner* — Matthew E. Gordon
(74) *Attorney, Agent, or Firm* — Muncy, Geissler, Olds & Lowe, P.C.

(57) ABSTRACT

A display panel, a method for manufacturing the same, a display device and a method for manufacturing the same are
(Continued)

provided. The display panel includes a display region and a peripheral region arranged on a substrate, and further includes multiple active driving circuits and multiple redundant driving circuits. At least one active driving circuit is electrically connected to at least one of multiple pixel units, and each redundant driving circuit includes at least one electrode layer arranged on the substrate. The peripheral region includes a flat region and a curved region, at least part of the redundant driving circuits are located in a flat redundant driving circuit region included in the flat region. The flat redundant driving circuit region includes at least two alignment mark regions. In the alignment mark regions, at least one electrode layer is hollowed out, and/or at least one electrode layer is filled up.

19 Claims, 18 Drawing Sheets

(51) Int. Cl.
*H10K 50/84* (2023.01)
*H10K 50/87* (2023.01)
*H10K 59/12* (2023.01)
*H10K 59/121* (2023.01)
*H10K 59/131* (2023.01)
*H10K 71/00* (2023.01)

(52) U.S. Cl.
CPC ....... *H10K 59/1216* (2023.02); *H10K 59/131* (2023.02); *H10K 71/00* (2023.02); *H01L 2223/54426* (2013.01); *H10K 59/1201* (2023.02)

(58) Field of Classification Search
CPC ...... H10K 50/87; H10K 71/00; H10K 71/191; H01L 23/544; H01L 2223/54426; H01L 2223/54486
USPC ........................................................ 257/797
See application file for complete search history.

(56) References Cited

U.S. PATENT DOCUMENTS

| | | | |
|---|---|---|---|
| 2009/0091701 | A1 | 4/2009 | Kondo |
| 2010/0245997 | A1 | 9/2010 | Shinohara et al. |
| 2014/0152630 | A1 | 6/2014 | Koyama |
| 2016/0140897 | A1 | 5/2016 | Park et al. |
| 2016/0270209 | A1 | 9/2016 | Cho |
| 2016/0327841 | A1 | 11/2016 | Jia et al. |
| 2017/0287937 | A1 | 10/2017 | Ka et al. |
| 2017/0338440 | A1 | 11/2017 | Oh et al. |
| 2018/0062111 | A1 | 3/2018 | Kim |
| 2019/0189707 | A1 | 6/2019 | Hyeon et al. |
| 2019/0229175 | A1* | 7/2019 | Lhee ................ H10K 59/88 |
| 2019/0318693 | A1 | 10/2019 | Jung et al. |
| 2020/0219956 | A1 | 7/2020 | Aoki et al. |
| 2020/0233249 | A1 | 7/2020 | Tang |
| 2021/0027039 | A1 | 1/2021 | Yi et al. |
| 2021/0351249 | A1 | 11/2021 | Yang et al. |

FOREIGN PATENT DOCUMENTS

| | | |
|---|---|---|
| CN | 107742623 A | 2/2018 |
| CN | 108873413 A | 11/2018 |
| CN | 109460731 A | 3/2019 |
| CN | 208705624 U | 4/2019 |
| EP | 1536473 A1 | 6/2005 |
| JP | H1020265 A | 1/1998 |
| JP | 2003015555 A | 1/2003 |
| JP | 2007071944 A | 3/2007 |
| JP | 2009092752 A | 4/2009 |
| JP | 2010060866 A | 3/2010 |
| JP | 2010231009 A | 10/2010 |
| JP | 2014130336 A | 7/2014 |
| JP | 2017079056 A | 4/2017 |
| JP | 2018010203 A | 1/2018 |
| JP | 2019066750 A | 4/2019 |
| WO | WO2019095734 A1 | 5/2019 |

OTHER PUBLICATIONS

Extended European Search Report dated May 23, 2023 from corresponding EP Application No. 20897638.1, 10 pages.

* cited by examiner

DISPLAY PANEL INCLUDING REDUNDANT DRIVING CIRCUITS THAT FORM ALIGNMENT MARKS IN A PERIPHERAL REGION THEREOF, METHOD FOR MANUFACTURING THE SAME, DISPLAY DEVICE AND METHOD FOR MANUFACTURING THE SAME

CROSS-REFERENCE TO RELATED APPLICATION

The present application is a U.S. national phase application of a PCT Application No. PCT/CN2020/089362 filed on May 9, 2020, a disclosure of which is incorporated in its entirety by reference herein.

TECHNICAL FIELD

The present disclosure relates to the field of display technologies, in particular to a display panel, a method for manufacturing the display panel, a display device and a method for manufacturing the display device.

BACKGROUND

As requirements on a display device increase, the number of circuits and wiring in a display panel is also increasing. A pad bending technique may be used for an upper or lower bezel of the display panel. The pad bending technique is to bend a part of the circuit board (the circuit board may be a flexible circuit board) included in the display device to a back surface of the display panel, and a heat dissipation film is laminated to a surface of the circuit board bent to the back surface of the display panel to dissipate heat generated during operation of a circuit. In order to improve the accuracy of bending alignment and the accuracy of laminating the heat dissipation film, it is necessary to carry out the alignment by identifying an alignment mark in the display panel. In the related art, it is impossible to provide a technical solution capable of performing an alignment marking accurately in a four-sided curved edge display panel without enlarging a bezel.

SUMMARY

In a first aspect, a display panel is provided in an embodiment of the present disclosure. The display panel includes a display region and a peripheral region arranged on a substrate, and includes a plurality of pixel units arranged in the display region. The peripheral region includes a region between the display region and an edge of the display panel. The display panel further includes a plurality of active driving circuits and a plurality of redundant driving circuits arranged in the peripheral region. At least one of the plurality of active driving circuits is electrically connected to at least one of the plurality of pixel units to drive the pixel unit for display, and each redundant driving circuit includes one or more electrode layers arranged on the substrate. The peripheral region includes a flat region and a curved region, and at least part of the plurality of redundant driving circuits is located in a flat redundant driving circuit region included in the flat region. The flat redundant driving circuit region includes at least two alignment mark regions. In each of the alignment mark regions, at least one of the electrode layers is hollowed out, and/or at least one of the electrode layers is filled up. A minimum distance between edges of orthographic projections of two adjacent alignment mark regions of the alignment mark regions onto the substrate is an alignment mark distance, and at least one alignment mark distance is larger than a predetermined alignment mark distance.

Optionally, the predetermined alignment mark distance is 10 times of a maximum pixel edge length. The maximum pixel edge length is a maximum value among pixel edge lengths of the plurality of pixel units, and the pixel edge length of a pixel unit is a length of an edge of an orthographic projection of the pixel unit onto the substrate.

Optionally, an area of an orthographic projection of each of the alignment mark regions onto the substrate is larger than a predetermined area, and the predetermined area is a maximum pixel area. The maximum pixel area is a maximum value among pixel areas of the plurality of pixel units, and the pixel area of a pixel unit is an area of an orthographic projection of the pixel unit onto the substrate.

Optionally, in each of the alignment mark regions, at least one of the electrode layers is filled up, and in a first region, the electrode layers are hollowed out. The first region is a region surrounding the alignment mark region and included in the flat redundant driving circuit region.

Optionally, the display panel includes an upper surface, a lower surface, a first side surface, a second side surface, a third side surface and a fourth side surface. Both the upper surface and the lower surface are flat surfaces. All the first side surface, the second side surface, the third side surface and the fourth side surface are curved side surfaces. An orthographic projection of the first side surface onto a first plane does not overlap an orthographic projection of the flat region onto the first plane. An orthographic projection of the second side surface onto the first plane does not overlap the orthographic projection of the flat region onto the first plane. An orthographic projection of the third side surface onto the first plane does not overlap the orthographic projection of the flat region onto the first plane. An orthographic projection of the fourth side surface onto the first plane does not overlap the orthographic projection of the flat region onto the first plane. The first plane is parallel to the lower surface.

Optionally, the first side surface is a left side surface, the second side surface is a lower side surface, the third side surface is an upper side surface, and the fourth side surface is a right side surface. The display panel further includes a circuit board arranged on the lower surface, and the circuit board is arranged at a lower side edge of the display panel. A longest distance between an orthographic projection of each of the alignment mark regions onto the first plane and a lower left rounded corner of an orthographic projection of a display region boundary of the display panel onto the first plane is smaller than a predetermined distance, and/or, a longest distance between the orthographic projection of each of the alignment mark regions onto the first plane and a lower right rounded corner of the orthographic projection of the display region boundary of the display panel onto the first plane is smaller than the predetermined distance.

Optionally, the first side surface is a left side surface, the second side surface is a lower side surface, the third side surface is an upper side surface, and the fourth side surface is a right side surface. The display panel further includes a circuit board arranged on the lower surface, and the circuit board is arranged at an upper side edge of the display panel. A longest distance between an orthographic projection of each of the alignment mark regions onto the first plane and an upper left rounded corner of an orthographic projection of a display region boundary of the display panel onto the first plane is smaller than a predetermined distance, and/or, a longest distance between the orthographic projection of each of the alignment mark regions onto the first plane and an upper right rounded corner of the orthographic projection of the display region boundary of the display panel onto the first plane is smaller than the predetermined distance.

Optionally, the first side surface is a left side surface, the second side surface is a lower side surface, the third side surface is an upper side surface, and the fourth side surface is a right side surface. The display panel further includes a circuit board arranged on the lower surface, and the circuit board is arranged at a lower side edge of the display panel. A longest distance between an orthographic projection of each of the alignment mark regions onto the first plane and an upper left rounded corner of an orthographic projection of a display region boundary of the display panel onto the first plane is smaller than a predetermined distance, and/or, a longest distance between the orthographic projection of each of the alignment mark regions onto the first plane and an upper right rounded corner of the orthographic projection of the display region boundary of the display panel onto the first plane is smaller than the predetermined distance.

Optionally, the first side surface is a left side surface, the second side surface is a lower side surface, the third side surface is an upper side surface, and the fourth side surface is a right side surface. The display panel further includes a circuit board arranged on the lower surface, and the circuit board is arranged at an upper side edge of the display panel. A longest distance between an orthographic projection of each of the alignment mark regions onto the first plane and a lower left rounded corner of an orthographic projection of a display region boundary of the display panel onto the first plane is smaller than a predetermined distance, and/or, a longest distance between the orthographic projection of each of the alignment mark regions onto the first plane and a lower right rounded corner of the orthographic projection of the display region boundary of the display panel onto the first plane is smaller than the predetermined distance.

Optionally, an edge of an orthographic projection of each of the alignment mark regions onto the substrate is of a circular shape, a polygonal shape, an L shape or a T shape.

Optionally, the display panel includes a semiconductor layer, a gate metal layer, and a source-drain metal layer sequentially arranged on the substrate; and in each of the alignment mark regions, both the gate metal layer and the source-drain metal layer are hollowed out.

Optionally, in each of the alignment mark regions, the semiconductor layer is also hollowed out, or the semiconductor layer is filled up.

Optionally, the display panel further includes an anode layer arranged on a surface of the source-drain metal layer away from the gate metal layer; and in each of the alignment mark regions, the anode layer is not provided with an opening, and the anode layer is filled up.

Optionally, the display panel further includes an anode layer arranged on a surface of the source-drain metal layer away from the gate metal layer; and in each of the alignment mark regions, the anode layer is hollowed out.

Optionally, in a first region, the anode layer is hollowed out; and the first region is a region surrounding the alignment mark region and included in the flat redundant driving circuit region.

Optionally, the display panel further includes an anode layer arranged on a surface of the source-drain metal layer away from the gate metal layer; and in each of the alignment mark regions, the anode layer includes an alignment mark pattern.

Optionally, an orthographic projection of the alignment mark pattern onto the substrate is of a circular shape, an L shape, a T shape or a polygonal shape.

Optionally, in a region other than the alignment mark region in a driving circuit zone, the anode layer is provided with a plurality of spaced openings.

Optionally, the gate metal layer includes a first gate metal layer and a second gate metal layer sequentially arranged on a surface of the semiconductor layer away from the substrate; and in each of the alignment mark regions, both the first gate metal layer and the second gate metal layer are hollowed out.

Optionally, in each of the alignment mark regions, the display panel further includes an anode layer arranged on a surface of the source-drain metal layer away from the gate metal layer; the display panel further includes a first insulation layer arranged between the semiconductor layer and the first gate metal layer, a second insulation layer arranged between the first gate metal layer and the second gate metal layer, a third insulation layer arranged between the second gate metal layer and the source-drain metal layer, and a fourth insulation layer arranged between the source-drain metal layer and the anode layer; and in each of the alignment mark regions, the first insulation layer, the second insulation layer, the third insulation layer and the fourth insulation layer are not hollowed out.

Optionally, the peripheral region includes a fan-out zone, a driving circuit zone and a signal line region sequentially arranged in a direction away from the display region; and the flat redundant driving circuit region is included in the driving circuit zone.

Optionally, the redundant driving circuit includes a plurality of stages of redundant shift register units, and the plurality of stages of redundant shift register units are not coupled to the plurality of pixel units.

Optionally, at least one stage of the plurality of stages of redundant shift register units includes the alignment mark regions, and the at least one stage of the plurality of stages of redundant shift register units is different from other redundant shift register units.

Optionally, in each of the alignment mark regions, at least one film layer included in an output transistor of the redundant driving circuit is hollowed out.

Optionally, the redundant driving circuit includes a redundant gate driving circuit and a redundant light-emission control circuit; the redundant light-emission control circuit is arranged on a side of the redundant gate driving circuit away from the display region, and includes a redundant light-emission control signal output line; in each of the alignment mark regions, the redundant light-emission control signal output line is hollowed out.

Optionally, in a region other than the alignment mark regions included in the flat redundant driving circuit region, a first electrode plate of a storage capacitor is arranged; in the region other than the alignment mark regions included in the flat redundant driving circuit region, a second electrode plate of the storage capacitor is not coupled to an output transistor included in the redundant driving circuit.

Optionally, each active driving circuit includes a plurality of stages of shift register units; the shift register units are coupled to corresponding rows of pixel units, and are configured to supply a gate driving signal and/or a light-emission control signal to the corresponding rows of pixel units.

In a second aspect, a method for manufacturing a display panel is further provided in an embodiment of the present disclosure. The display panel includes a display region and a peripheral region arranged on a substrate. The peripheral region includes a region between the display region and an edge of the display panel, and includes a flat region and a curved region. The flat region includes a flat redundant driving circuit region. The method for manufacturing the display panel includes: arranging a plurality of pixel units in the display region, and arranging a plurality of active driving circuits and a plurality of redundant driving circuits in the peripheral region; arranging at least part of the redundant driving circuits in the flat redundant driving circuit region, where the redundant driving circuit includes one or more electrode layers arranged on the substrate; arranging an alignment mark region in the flat redundant driving circuit region; and in each of the alignment mark regions, hollowing out at least one of the electrode layers, and/or filling up at least one of the electrode layers. A minimum distance between edges of orthographic projections of two adjacent alignment mark regions of the alignment mark regions onto the substrate is an alignment mark distance, and at least one alignment mark distance is larger than a predetermined alignment mark distance.

Optionally, the predetermined alignment mark distance is 10 times of a maximum pixel edge length; the maximum pixel edge length is a maximum value among pixel edge lengths of the plurality of pixel units; and the pixel edge length of a pixel unit is a length of an edge of an orthographic projection of the pixel unit onto the substrate.

In a third aspect, a display device is further provided in an embodiment of the present disclosure, the display device including the above-mentioned display panel.

Optionally, the display panel includes an upper surface, a lower surface, a first side surface, a second side surface, a third side surface and a fourth side surface. All the first side surface, the second side surface, the third side surface and the fourth side surface are curved side surfaces. An orthographic projection of the first side surface onto a first plane does not overlap an orthographic projection of the flat region onto the first plane. An orthographic projection of the second side surface onto the first plane does not overlap the orthographic projection of the flat region onto the first plane. An orthographic projection of the third side surface onto the first plane does not overlap the orthographic projection of the flat region onto the first plane. An orthographic projection of the fourth side surface onto the first plane does not overlap the orthographic projection of the flat region onto the first plane; and the first plane is parallel to the lower surface. The first side surface is a left side surface, the second side surface is a lower side surface, the third side surface is an upper side surface, and the fourth side surface is a right side surface. The display panel further includes a circuit board arranged on the lower surface, and the circuit board is arranged at a lower side edge or an upper side edge of the display panel. The display device further includes a heat dissipation film laminated to the lower surface, the first side surface, the second side surface, the third side surface and the fourth side surface.

Optionally, the display device further includes an encapsulation cover plate. The encapsulation cover plate includes a first surface, and a fifth side surface, a sixth side surface, a seventh side surface, and an eighth side surface closely adjacent to the first surface separately. The fifth side surface, the sixth side surface, the seventh side surface and the eighth side surface are curved side surfaces. The first surface is laminated to the upper surface, the fifth side surface is laminated to the first side surface, the sixth side surface is laminated to the second side surface, the seventh side surface is laminated to the third side surface, and the eighth side surface is laminated to the fourth side surface.

In a fourth aspect, a method for manufacturing a display device is further provided in an embodiment of the present disclosure. The display device includes a display panel, a heat dissipation film and an encapsulation cover plate. The display panel includes a display region and a peripheral region arranged on a substrate. The peripheral region includes a region between the display region and an edge of the display panel, and includes a flat region and a curved region. The flat region includes a flat redundant driving circuit region. The method for manufacturing the display device includes: arranging a plurality of pixel units in the display region, and arranging a plurality of active driving circuits and a plurality of redundant driving circuits in the peripheral region; arranging at least part of the redundant driving circuits in the flat redundant driving circuit region, where the redundant driving circuit includes one or more electrode layers arranged on the substrate; arranging an alignment mark region in the flat redundant driving circuit region; in each of the alignment mark regions, hollowing out at least one of the electrode layers, and/or filling up at least one of the electrode layers; and aligning and laminating the display panel with the encapsulation cover plate, and aligning and laminating the display panel with the heat dissipation film by using the alignment mark region. A minimum distance between edges of orthographic projections of two adjacent alignment mark regions of the alignment mark regions onto the substrate is an alignment mark distance, and at least one alignment mark distance is larger than a predetermined alignment mark distance.

BRIEF DESCRIPTION OF THE DRAWINGS

FIG. 5A and FIG. 5B are superimposed in the flat redundant driving circuit region;

FIG. 6A, FIG. 6B, and FIG. 6C are superimposed.

DETAILED DESCRIPTION

The technical solutions in the embodiments of the present disclosure will be described hereinafter clearly and completely with reference to the drawings of the embodiments of the present disclosure. Obviously, the described embodiments are merely a part of, rather than all of, the embodiments of the present disclosure, and based on these embodiments, a person of ordinary skill in the art may, without any creative effort, obtain other embodiments, which also fall within the scope of the present disclosure.

As requirements on a display device increase, the number of circuits and wiring in a display panel is also increasing. A pad bending technique may be used for an upper or lower bezel of the display panel. The pad bending technique is to bend a part of the circuit board (the circuit board may be a flexible circuit board) included in the display device to a back surface of the display panel, and a heat dissipation film is laminated to a surface of the circuit board bent to the back surface of the display panel to dissipate heat generated during operation of a circuit. In order to improve the accuracy of bending alignment and the accuracy of laminating the heat dissipation film, it is necessary to carry out the alignment by identifying an alignment mark in the display panel. In a specific implementation, the alignment mark may include a pad bending alignment mark and/or a heat dissipation film laminating alignment mark, and a position may be locked by identifying the alignment mark with an alignment camera. Since sharpness of a pattern identified by the alignment camera focused on the pattern is related to the consistency of an object distance, the alignment mark is required be arranged in a flat region where a surface of the display panel is flat.

Figure 1A:
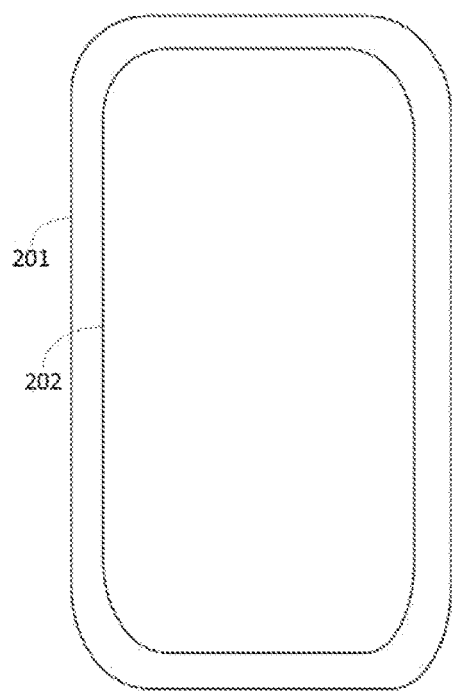
FIG. 1A, FIG. 1B, and FIG. 1C are each a top view of a four-sided curved edge display panel with four side surfaces thereof not bent after a pad bending is performed.
Figure 1B:
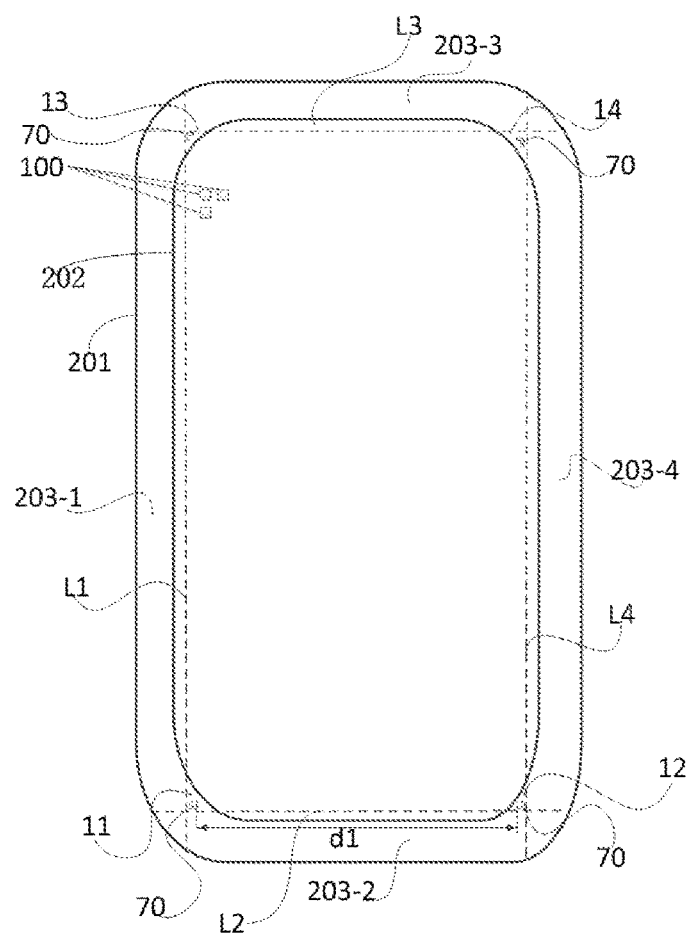
Figure 1C:
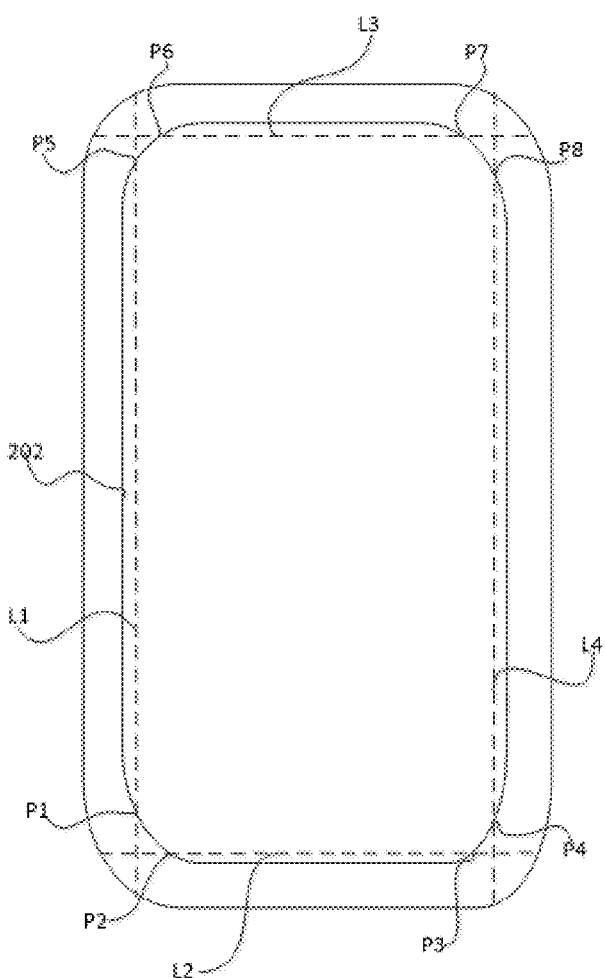

In a case that the display panel is a four-sided curved edge display panel, an upper surface and a lower surface of the display panel are each a flat surface, an upper side surface, a lower side surface, a left side surface and a right side surface of the display panel are each a curved side surface, so an area of the flat region is small. FIG. 1A, FIG. 1B, and FIG. 1C are each a top view of the four-sided curved edge display panel with four side surfaces thereof not bent after a pad bending is performed.

In FIG. 1A, 201 denotes an edge of the display panel, 202 denotes a display region boundary, and the display region of the display panel is within the display region boundary 202.

A peripheral region of the display panel is a region between the display region included in the display panel and the edge 201 of the display panel.

In FIG. 1B, 201 denotes the edge of the display panel, 203-1 denotes a left side curved region of the display panel, 203-2 denotes a lower side curved region of the display panel, 203-3 denotes an upper side curved region of the display panel, and 203-4 denotes a right side curved region of the display panel.

In FIG. 1B, L1 denotes a first dotted line, and a region on the left side of the display panel enclosed by the first dotted line L1 and the edge of the display panel is the left side curved region 203-1 of the display panel.

L2 denotes a second dotted line, and a region on the lower side of the display panel enclosed by the second dotted line L2 and the edge of the display panel is the lower side curved region 203-2 of the display panel.

L3 denotes a third dotted line, and a region on the upper side of the display panel enclosed by the third dotted line L3 and the edge of the display panel is the upper side curved region 203-3 of the display panel.

L4 denotes a fourth dotted line, and a region on the right side of the display panel enclosed by the fourth dotted line L4 and the edge of the display panel is the right side curved region 203-4 of the display panel.

The flat region in the peripheral region of the display panel may be a region in the peripheral region of the display panel that is not covered by the left side curved region 203-1, the lower side curved region 203-2, the upper side curved region 203-3 and the right side curved region 203-4. The curved region may be a region other than the flat region included in the peripheral region.

In FIG. 1B, 11 denotes a first flat region included in the flat region of the display panel, 12 denotes a second flat region included in the flat region of the display panel, 13 denotes a third flat region included in the flat region of the display panel, and 14 denotes a fourth flat region included in the flat region of the display panel. That is, in the four-sided curved edge display panel, the flat region is located at the upper left side, lower left side, upper right side and lower right side, and is adjacent to the display region.

In FIG. 1B, the first flat region 11 is a flat region located on the lower left side of the display panel, the second flat region 12 is a flat region located on the lower right side of the display panel, the third flat region 13 is a flat region located on the upper left side of the display panel, and the fourth flat region 14 is a flat region located on the upper right side of the display panel.

The first flat region 11 is close to a lower left rounded corner of the display region boundary 202, the second flat region 12 is close to a lower right rounded corner of the display region boundary 202, the third flat region 13 is close to a upper left rounded corner of the display region boundary 202, and the fourth flat region 14 is close to a upper right rounded corner of the display region boundary 202.

In at least one embodiment of the present disclosure, an orthographic projection of the left side surface of the display panel onto a first plane may overlap an orthographic projection of the left side curved region 203-1 onto the first plane, an orthographic projection of the lower side surface of the display panel onto the first plane may overlap an orthographic projection of the lower side curved region 203-2 onto the first plane, an orthographic projection of the upper side surface of the display panel onto the first plane may overlap an orthographic projection of the upper side curved region 203-3 onto the first plane, and an orthographic projection of the right side surface of the display panel onto the first plane may overlap an orthographic projection of the right side curved region 203-3 onto the first plane.

The first plane is a plane parallel to the lower surface of the display panel.

As shown in FIG. 1C, the lower left rounded corner of the display region boundary 202 may be a portion between a first intersection point P1 and a second intersection point P2 included in the display region boundary 202. The first intersection point P1 is an intersection point of the first dotted line L1 and a lower left part of the display region boundary 202, and the second intersection point P2 is an intersection point of the second dotted line L2 and a lower left part of the display region boundary 202.

As shown in FIG. 1C, the lower right rounded corner of the display region boundary 202 may be a portion between a third intersection point P3 and a fourth intersection point P4 included in the display region boundary 202. The third intersection point P3 is an intersection point of the second dotted line L2 and a lower right part of the display region boundary 202, and the fourth intersection point P4 is an intersection point of the fourth dotted line L4 and a lower left part of the display region boundary 202.

As shown in FIG. 1C, the upper left rounded corner of the display region boundary 202 may be a portion between a fifth intersection point P5 and a sixth intersection point P6 included in the display region boundary 202. The fifth intersection point P5 is an intersection point of the first dotted line L1 and an upper left part of the display region boundary 202, and the sixth intersection point P6 is an intersection point of the third dotted line L3 and an upper left part of the display region boundary 202.

As shown in FIG. 1C, the upper right rounded corner of the display region boundary 202 may be a portion between a seventh intersection point P7 and an eighth intersection point P8 included in the display region boundary 202. The seventh intersection point P7 is an intersection point of the third dotted line L3 and an upper right part of the display region boundary 202, and the eighth intersection point P8 is an intersection point of the fourth dotted line L4 and an upper left part of the display region boundary 202.

Figure 2A:
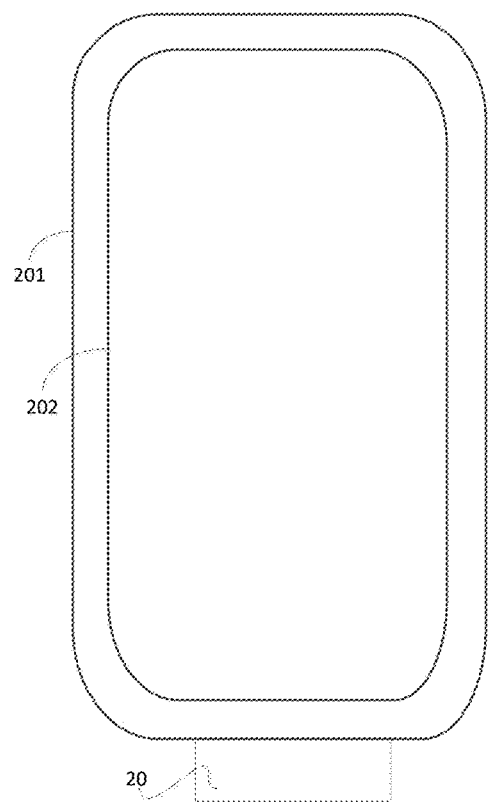
FIG. 2A is a top view of a four-sided curved edge display panel before a pad bending is performed.

FIG. 2A is a top view of a four-sided curved edge display panel before a pad bending is performed. In FIG. 2A, 20 denotes a circuit board, and the circuit board 20 may be a flexible circuit board. The circuit board 20 is required to be bent to the back surface of the display panel during manufacturing the four-sided curved edge display panel.

In at least one embodiment of the present disclosure, in a case that the circuit board 20 is bent to the back surface of the display panel, in order to dissipate heat, heat dissipation films may be laminated to the back surface of the display panel and four side surfaces of the display panel.

In at least one embodiment of the present disclosure, in a case that the circuit board 20 is arranged at a lower side edge of the display panel, the circuit board 20 is required to be bent to the back surface of the display panel, and the alignment mark 70 may be arranged in the first flat region 11 and/or the second flat region 12 for bending alignment and alignment for laminating the heat dissipation film. Moreover, in the case that the circuit board 20 is arranged at the lower side edge of the display panel, since it is also necessary to laminate the heat dissipation film to the upper side surface of the display panel, the alignment mark 70 may be further arranged in the third flat region 13 and/or the fourth flat region 14 to act as the alignment mark for laminating the heat dissipation film.

In a specific implementation, in the case that the circuit board 20 is arranged at the lower side edge of the display panel, a bending alignment mark may further be arranged on the circuit board. The bending alignment may be performed by using the bending alignment mark arranged on the circuit board and the alignment mark 70 arranged in the first flat region 11 and/or the second flat region 12 in conjunction.

In at least one embodiment of the present disclosure, in a case that the circuit board 20 is arranged at an upper side edge of the display panel, the circuit board 20 is required to be bent to the back surface of the display panel, and the alignment mark 70 may be arranged in the third flat region 13 and/or the fourth flat region 14 for bending alignment and alignment for laminating the heat dissipation film. Moreover, in the case that the circuit board 20 is arranged at the upper side edge of the display panel, since it is also necessary to laminate the heat dissipation film to the lower side surface of the display panel, the alignment mark 70 may further be arranged in the first flat region 11 and/or the second flat region 12 to act as the alignment mark for laminating the heat dissipation film.

In a specific implementation, in the case that the circuit board 20 is arranged at the upper side edge of the display panel, a bending alignment mark may further be arranged on the circuit board. The bending alignment may be performed by using the bending alignment mark arranged on the circuit board and the alignment mark 70 arranged in the third flat region 13 and/or the fourth flat region 14 in conjunction. In the peripheral region of the display panel, a fan-out zone, a driving circuit zone and a signal line region may be sequentially arranged in a direction away from the display region.

The fan-out zone is a region where a connection line between a data line in the display region and a source driver is located, and a high voltage signal line may be arranged in the fan-out zone. The high voltage signal line is used to supply a high voltage signal VDD.

A low voltage signal line may be arranged in the signal line region, and the low voltage signal line is used to supply a low voltage signal VSS.

The driving circuit zone may include a driving circuit region and a redundant driving circuit region, and the redundant driving circuit region may include a flat redundant driving circuit region.

In the driving circuit region, an active driving circuit including a plurality of stages of shift register units is arranged. The active driving circuit may include a gate driving circuit for supplying a gate driving signal to each of a plurality of rows of pixel units in the display region. Optionally, the active driving circuit may also include a light-emission control circuit used to supply a light-emission control signal to a plurality of rows of pixel units in the display region.

In the redundant driving circuit region, a redundant driving circuit is arranged, and the redundant driving circuit may include at least one stage of redundant shift register unit. The redundant shift register unit is not coupled to the pixel units in the display region, and is reserved only to maintain a uniform etching and a reasonable layout. A fixed voltage signal may be applied to a signal line in the redundant shift register unit to reduce the impact of signal jump on the active driving circuit in the driving circuit region.

In at least one embodiment of the present disclosure, the driving circuit zone may include a blank region between a driving circuit and the fan-out zone, and a blank region between the driving circuit and the signal line region, but the present disclosure is not limited thereto.

In at least one embodiment of the present disclosure, in the fan-out zone, a gate metal layer and an anode layer may be sequentially arranged on the substrate. The gate metal layer may include a first gate metal layer and a second gate metal layer. The connection line between the data line and the source driver may be arranged on the first gate metal layer and the second gate metal layer. Moreover, in the fan-out zone, the anode layer may be provided with a plurality of openings for venting of an organic film layer.

In at least one embodiment of the present disclosure, in the signal line region, a semiconductor layer, a source-drain metal layer and an anode layer may be sequentially arranged on the substrate, and the source-drain metal layer includes the low voltage signal line.

In the signal line region, an object of arranging the anode layer on the source-drain metal layer is to bond a cathode of a light-emitting element in the display region to the low voltage signal line (an area of the anode layer overlying the source-drain metal layer is determined by the bonding between the low voltage signal line and the cathode).

Moreover, in the signal line region, the anode layer may be provided with a plurality of openings for venting of an organic film layer.

Figure 3:
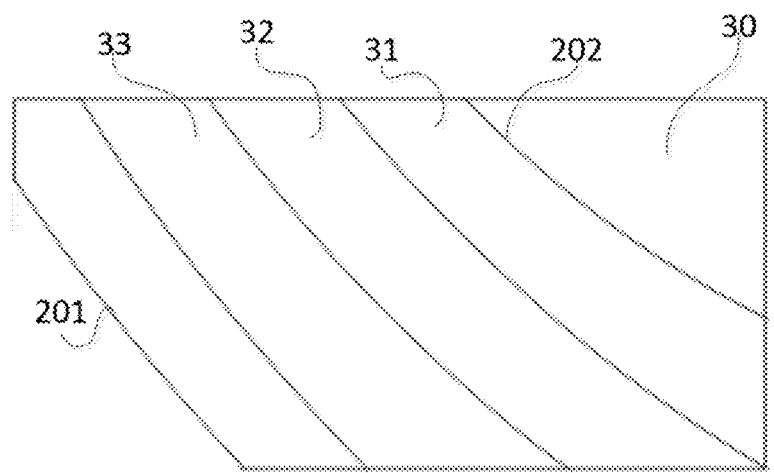
FIG. 3 is a schematic diagram of a regional division of a lower left rounded corner of the display panel in FIG. 1B.

FIG. 3 is a schematic diagram of a regional division of a lower left rounded corner of the display panel in FIG. 1B. In FIG. 3, 30 denotes an AA zone, 31 denotes the fan-out zone, 32 denotes the driving circuit zone, 33 denotes the signal line region, 201 denotes the edge of the display panel, and 202 denotes the display region boundary.

As shown in FIG. 1B, when the circuit board 20 is arranged at the lower side edge of the display panel, in a preferred case, the alignment mark 70 may be arranged in the first flat region 11 and/or the second flat region 12, but the present disclosure is not limited thereto.

In at least one embodiment of the present disclosure, in a case that the circuit board to be bent is arranged at the upper side edge of the display panel, the alignment mark region may preferably be arranged in the third flat region 13 and/or the fourth flat region 14, but the present disclosure is not limited thereto.

In at least one embodiment of the present disclosure, the flat region may include at least a partial region of the redundant driving circuit region. In a case that the flat region includes at least a partial region of the redundant driving circuit region, the at least a partial region of the redundant driving circuit region is the flat redundant driving circuit region.

In at least one embodiment of the present disclosure, since the redundant driving circuit is arranged for process uniformity in the redundant driving circuit region, and the redundant driving circuit is not coupled to the pixel units in the display region to supply a gate driving signal and a light-emission control signal to the pixel units, even if at least one of the gate metal layer, the source-drain metal layer, the semiconductor layer and the anode layer is hollowed-out in the alignment mark regions included in the flat redundant driving circuit region, the display of the display panel will not be affected. Therefore, in at least one embodiment of the present disclosure, it is decided to arrange alignment mark regions in the flat redundant driving circuit region, to achieve an accurate alignment without enlarging a bezel and affecting the display.

FIG. 1B is a top view of the four-sided curved edge display panel with four side surfaces thereof not bent. The four side surfaces of the four-sided curved edge display panel need to be bent during manufacturing the display panel. Assuming that the upper surface is a display surface of the four-sided curved edge display panel in FIG. 1B, the four side surfaces are bent along the first dotted line L1, the second dotted line L2, the third dotted line L3 and the fourth dotted line L4, such that the bent side surfaces are close to the upper surface. Since 202 denotes the display region boundary in FIG. 1A, after the four side surfaces are bent, a part between the display region boundary 202 on the left side of the display region and the first dotted line L1 is bent to the left side surface, a part between the display region boundary 202 on the right side of the display region and the fourth dotted line L4 is bent to the right side surface, a part between the display region boundary 202 on the lower side of the display region and the second dotted line L2 is bent to the lower side surface, and a part between the display region boundary 202 on the upper side of the display region and the third dotted line L3 is bent to the upper side surface.

Figure 2B:
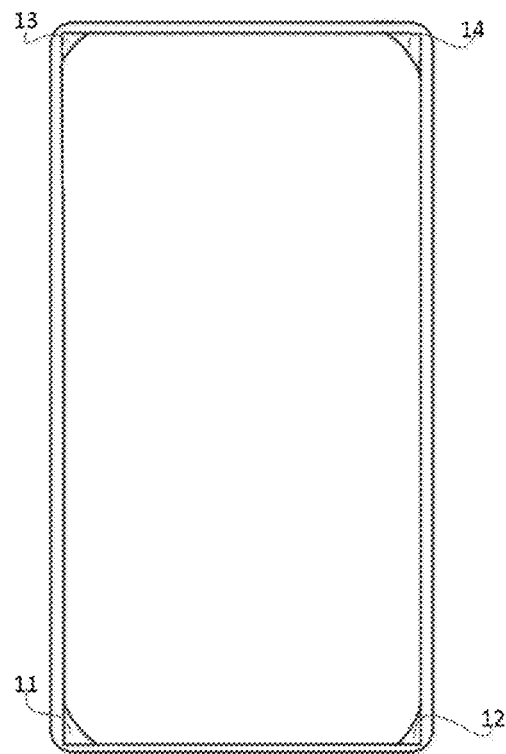
FIG. 2B is a top view of the four-sided curved edge display panel after the four side surfaces thereof are bent.

FIG. 2B is a top view of the four-sided curved edge display panel after the four side surfaces thereof are bent. In FIG. 2B, the flat region includes the first flat region 11, the second flat region 12, the third flat region 13 and the fourth flat region 14.

Figure 2C:
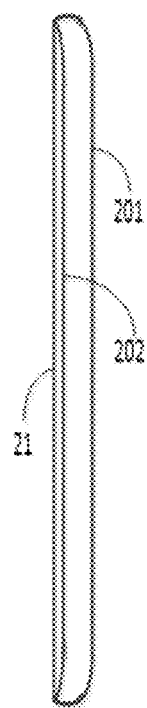
FIG. 2C is a left view of the four-sided curved edge display panel after the four side surfaces thereof are bent.

FIG. 2C is a left view of the four-sided curved edge display panel after the four side surfaces thereof are bent. In FIG. 2C, 21 denotes a side edge corresponding to the first dotted line L1, 201 denotes the edge of the display panel, and 202 denotes the display region boundary.

Figure 2D:
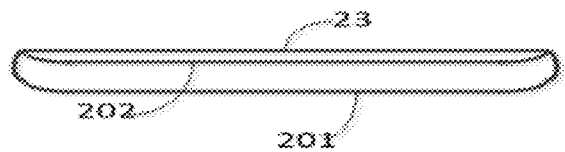
FIG. 2D is a bottom view of the four-sided curved edge display panel after the four side surfaces thereof are bent.

FIG. 2D is a bottom view of the four-sided curved edge display panel after the four side surfaces thereof are bent. In FIG. 2D, 23 denotes a side edge corresponding to the third dotted line L3, 201 denotes the edge of the display panel, and 202 denotes the display region boundary.

According to at least one embodiment of the present disclosure, the display panel includes a display region and a peripheral region arranged on a substrate, and further includes a plurality of pixel units 100 arranged in the display region. The peripheral region includes a region between the display region and an edge of the display panel. The display panel further includes a plurality of active driving circuits and a plurality of redundant driving circuits arranged in the peripheral region. At least one of the plurality of active driving circuits is electrically connected to at least one of the plurality of pixel units 100 to drive the pixel unit 100 for display, and each redundant driving circuit includes one or more electrode layers arranged on the substrate. The peripheral region includes a flat region and a curved region, and at least part of the plurality of redundant driving circuits is located in a flat redundant driving circuit region included in the flat region. The flat redundant driving circuit region includes at least two alignment mark regions. In the alignment mark regions, at least one of the electrode layers is hollowed out, and/or at least one of the electrode layers is filled up. A minimum distance between edges of orthographic projections of two adjacent alignment mark regions of the alignment mark regions onto the substrate is an alignment mark distance d1, and at least one alignment mark distance d1 is larger than a predetermined alignment mark distance.

The display panel according to at least one embodiment of the present disclosure is provided with the alignment mark regions in the flat redundant driving circuit region. In the alignment mark regions, at least one of the electrode layers is hollowed out, such that a light transmittance of the alignment mark regions is larger than a light transmittance of a surrounding region, thus accurate alignment marking is performed; and/or, in the alignment mark regions, at least one of the electrode layers is filled up, and the electrode layer may reflect light to form a strong contrast with other regions, so that alignment marking can be realized.

In at least one embodiment of the present disclosure, the surrounding region may be regions included in the peripheral region that are closer to the alignment mark regions.

There is no need to provide a dedicated alignment mark pattern in the display panel according to at least one embodiment of the present disclosure, instead at least one of the electrode layers is hollowed out and/or at least one electrode layer is filled up in the alignment mark regions to achieve the alignment, thereby saving the space significantly.

In at least one embodiment of the present disclosure, since the alignment mark region may be arranged at at least one of the lower left rounded corner, the lower right rounded corner, the upper left rounded corner and the upper right rounded corner of the display panel, at least one alignment mark distance d1 is set to be larger than a predetermined alignment mark distance.

In at least one embodiment of the present disclosure, the electrode layer may be at least one of the gate metal layer, the source-drain metal layer and the anode layer, but the present disclosure is not limited thereto.

Optionally, the predetermined alignment mark distance is 10 times of a maximum pixel edge length. The maximum pixel edge length is a maximum value among pixel edge lengths of the plurality of pixel units 100, and the pixel edge length of a pixel unit 100 is a length of an edge of an orthographic projection of the pixel unit 100 onto the substrate.

In at least one embodiment of the present disclosure, an area of an orthographic projection of each of the alignment mark regions onto the substrate may be larger than a predetermined area, and the predetermined area is a maximum pixel area. The maximum pixel area is a maximum value among pixel areas of the plurality of pixel units, and the pixel area of a pixel unit is an area of an orthographic projection of the pixel unit onto the substrate.

Optionally, the redundant driving circuit may further include at least one semiconductor layer arranged on the substrate, and in the alignment mark regions, the at least one semiconductor layer is hollowed out, or the at least one semiconductor layer is filled up.

In a specific implementation, the redundant driving circuit may further include the semiconductor layer. In the alignment mark regions, the semiconductor layer is hollowed out or filled up. In the alignment mark regions, in a case that the semiconductor layer is hollowed out, the light transmittance of the alignment mark regions is further increased, so that alignment marking can be realized.

Optionally, in each of the alignment mark regions, at least one of the electrode layers is filled up, and in a first region, the electrode layers are hollowed out. The first region is a region surrounding the alignment mark region and included in the flat redundant driving circuit region.

In a specific implementation, there is the first region around the alignment mark region. In the alignment mark region, at least one of the electrode layers is filled up, and in the first region, the electrode layers are hollowed out, thus not only the light transmittance of the alignment mark region can be increased, but also a strong contrast with other regions can be formed as the at least one electrode layer in the alignment mark region reflects light, so that alignment marking can be realized.

In at least one embodiment of the present disclosure, the first region is a partial region included in the flat redundant driving circuit region and surrounds the alignment mark region.

In a specific implementation, in the flat region, a surface of the display panel is flat.

Optionally, the display panel includes an upper surface, a lower surface, a first side surface, a second side surface, a third side surface and a fourth side surface. Both the upper surface and the lower surface are flat surfaces. All the first side surface, the second side surface, the third side surface and the fourth side surface are curved side surfaces. An orthographic projection of the first side surface onto a first plane does not overlap an orthographic projection of the flat region onto the first plane. An orthographic projection of the second side surface onto the first plane does not overlap the orthographic projection of the flat region onto the first plane. An orthographic projection of the third side surface onto the first plane does not overlap the orthographic projection of the flat region onto the first plane. An orthographic projection of the fourth side surface onto the first plane does not overlap the orthographic projection of the flat region onto the first plane. The first plane is parallel to the lower surface.

In at least one embodiment of the present disclosure, the display panel may be a four-sided curved edge display panel. FIG. 1B is a top view of the four-sided curved edge display panel. The first side surface may be the left side surface in FIG. 1B, the second side surface may be the lower side surface in FIG. 1B, the third side surface may be the upper side surface in FIG. 1B, and the fourth side surface may be the right side surface in FIG. 1B, but the present disclosure is not limited thereto.

According to a specific implementation, the first side surface may be the left side surface, the second side surface may be the lower side surface, the third side surface may be the upper side surface, and the fourth side surface may be the right side surface. The display panel may further include a circuit board arranged on the lower surface, and the circuit board is arranged at the lower side edge of the display panel. A longest distance between an orthographic projection of each of the alignment mark regions onto the first plane and a lower left rounded corner of an orthographic projection of the display region boundary of the display panel onto the first plane is smaller than a predetermined distance, and/or, a longest distance between the orthographic projection of each of the alignment mark regions onto the first plane and a lower right rounded corner of the orthographic projection of the display region boundary of the display panel onto the first plane is smaller than the predetermined distance.

In a specific implementation, the predetermined distance may be determined according to the actual situation. For example, the predetermined distance may be greater than or equal to 300 microns and less than or equal to 1100 microns, but the present disclosure is not limited thereto.

In at least one embodiment of the present disclosure, in the case that the circuit board is arranged at the lower side edge of the display panel, the alignment mark region may be arranged close to the lower left rounded corner of the display region boundary, and/or, close to the lower right rounded corner of the display region boundary.

Figure 1D:
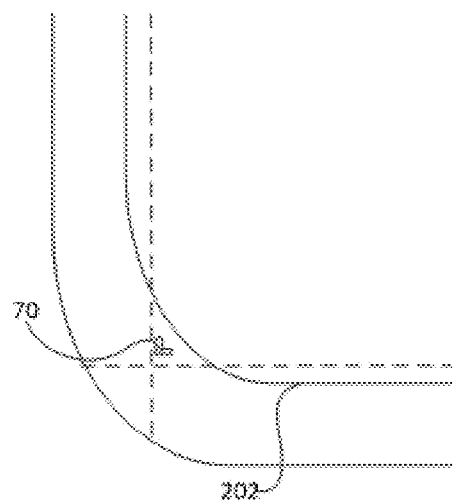
FIG. 1D is a schematic diagram of a case where an alignment mark region 70 is arranged at the lower left region of a four-sided curved edge display panel.

As shown in FIG. 1D, in a case that the alignment mark region 70 is close to the lower left rounded corner of the display region boundary 202, a longest distance between an orthographic projection of the alignment mark region 70 onto the first plane and the lower left rounded corner of the display region boundary 202 is: a longest distance between any point on a boundary line of the orthographic projection of the alignment mark region 70 onto the first plane and any point at the lower left rounded corner of the display region boundary 202. In FIG. 1D, the alignment mark region 70 is L-shaped, but the present disclosure is not limited thereto.

In at least one embodiment of the present disclosure, in a case that the alignment mark region is close to the lower right rounded corner of the display region boundary, a longest distance between the orthographic projection of the alignment mark region onto the first plane and the lower right rounded corner of the orthographic projection of the display region boundary of the display panel onto the first plane may refer to: a longest distance between any point on the boundary line of the orthographic projection of the alignment mark region onto the first plane and any point at the lower right rounded corner of the display region boundary.

According to another specific implementation, the first side surface may be the left side surface, the second side surface may be the lower side surface, the third side surface may be the upper side surface, and the fourth side surface may be the right side surface. The display panel may further include the circuit board arranged on the lower surface, and the circuit board is arranged at the upper side edge of the display panel. A longest distance between an orthographic projection of each of the alignment mark regions onto the first plane and an upper left rounded corner of an orthographic projection of a display region boundary of the display panel onto the first plane is smaller than a predetermined distance, and/or, a longest distance between the orthographic projection of each of the alignment mark regions onto the first plane and an upper right rounded corner of the orthographic projection of the display region boundary of the display panel onto the first plane is smaller than the predetermined distance In at least one embodiment of the present disclosure, in a case that the alignment mark region is close to the upper left rounded corner of the display region boundary, a longest distance between the orthographic projection of the alignment mark region onto the first plane and the upper left rounded corner of the orthographic projection of the display region boundary of the display panel onto the first plane refers to: a longest distance between any point on the boundary line of the orthographic projection of the alignment mark region onto the first plane and any point at the upper left rounded corner of the display region boundary.

In at least one embodiment of the present disclosure, in a case that the alignment mark region is close to the upper right rounded corner of the display region boundary, a longest distance between the orthographic projection of the alignment mark region onto the first plane and the upper right rounded corner of the orthographic projection of the display region boundary of the display panel onto the first plane refers to: a longest distance between any point on the boundary line of the orthographic projection of the alignment mark region onto the first plane and any point at the upper right rounded corner of the display region boundary.

In a specific implementation, the predetermined distance may be determined according to the actual situation. For example, the predetermined distance may be greater than or equal to 300 microns and less than or equal to 1100 microns, but the present disclosure is not limited thereto.

In at least one embodiment of the present disclosure, in the case that the circuit board is arranged at the upper side edge of the display panel, the alignment mark region may be arranged close to the upper left rounded corner of the display region boundary, and/or, close to the upper right rounded corner of the display region boundary.

In at least one embodiment of the present disclosure, the first side surface may be the left side surface, the second side surface may be the lower side surface, the third side surface may be the upper side surface, and the fourth side surface may be the right side surface. The display panel further includes a circuit board arranged on the lower surface, and the circuit board is arranged at the lower side edge of the display panel. A longest distance between an orthographic projection of each of the alignment mark regions onto the first plane and an upper left rounded corner of an orthographic projection of a display region boundary of the display panel onto the first plane is smaller than a predetermined distance, and/or, a longest distance between the orthographic projection of each of the alignment mark regions onto the first plane and an upper right rounded corner of the orthographic projection of the display region boundary of the display panel onto the first plane is smaller than the predetermined distance.

In a specific implementation, the predetermined distance may be determined according to the actual situation. For example, the predetermined distance may be greater than or equal to 300 microns and less than or equal to 1100 microns, but the present disclosure is not limited thereto.

In at least one embodiment of the present disclosure, in the case that the circuit board is arranged at the lower side edge of the display panel, the alignment mark region may be arranged close to the upper left rounded corner of the display region boundary, and/or, close to the upper right rounded corner of the display region boundary.

In at least one embodiment of the present disclosure, the first side surface may be the left side surface, the second side surface may be the lower side surface, the third side surface may be the upper side surface, and the fourth side surface may be the right side surface. The display panel further includes the circuit board arranged on the lower surface, and the circuit board is arranged at the upper side edge of the display panel. A longest distance between an orthographic projection of each of the alignment mark regions onto the first plane and a lower left rounded corner of an orthographic projection of a display region boundary of the display panel onto the first plane is smaller than a predetermined distance, and/or, a longest distance between the orthographic projection of each of the alignment mark regions onto the first plane and a lower right rounded corner of the orthographic projection of the display region boundary of the display panel onto the first plane is smaller than the predetermined distance.

In a specific implementation, the predetermined distance may be determined according to the actual situation. For example, the predetermined distance may be greater than or equal to 300 microns and less than or equal to 1100 microns, but the present disclosure is not limited thereto.

In at least one embodiment of the present disclosure, in the case that the circuit board is arranged at the upper side edge of the display panel, the alignment mark region may be arranged close to the lower left rounded corner of the display region boundary, and/or, close to the lower right rounded corner of the display region boundary.

In a specific implementation, the display panel includes the semiconductor layer, the gate metal layer and the source-drain metal layer sequentially arranged on the substrate; and in each of the alignment mark regions, both the gate metal layer and the source-drain metal layer are hollowed out In at least one embodiment of the present disclosure, the at least one electrode layer included in the redundant driving circuit may include the gate metal layer and the source-drain metal layer, but the present disclosure is not limited thereto.

Preferably, in each of the alignment mark regions, the semiconductor layer is also hollowed out.

In a specific implementation, the alignment mark regions may be included in the flat redundant driving circuit region. Except for the alignment mark regions, the circuit wiring is dense in the peripheral region close to the alignment mark regions. Since the wiring is opaque to visible light, under a certain backlight condition, the wiring may appear black in the field of view of the alignment camera. In contrast, there is no wiring arranged in the alignment mark regions, the backlight may almost completely pass through the alignment mark regions and enter the alignment camera, thereby a strong contrast with the surrounding region is formed. As a result, the alignment camera may identify the alignment mark regions.

In a specific implementation, in the alignment mark regions, the semiconductor layer may also be filled up.

In a specific implementation, the display panel further includes an anode layer arranged on a surface of the source-drain metal layer away from the gate metal layer; and in the alignment mark regions, the anode layer is not provided with an opening, and the anode layer is filled up, so that the alignment camera may identify the alignment mark regions.

In at least one embodiment of the present disclosure, the at least one electrode layer included in the redundant driving circuit may further include the anode layer, but the present disclosure is not limited thereto.

Optionally, the anode layer may be of a stacked structure, and the anode layer may include a first indium tin oxide layer, an argentum layer and a second indium tin oxide layer arranged sequentially, but the present disclosure is not limited thereto.

Optionally, an edge of an orthographic projection of each alignment mark region onto the substrate is of a circular shape, a polygonal shape, an L shape or a T shape.

In at least one embodiment of the present disclosure, the gate metal layer may include the first gate metal layer and the second gate metal layer sequentially arranged on a surface of the semiconductor layer away from the substrate.

Figure 4:
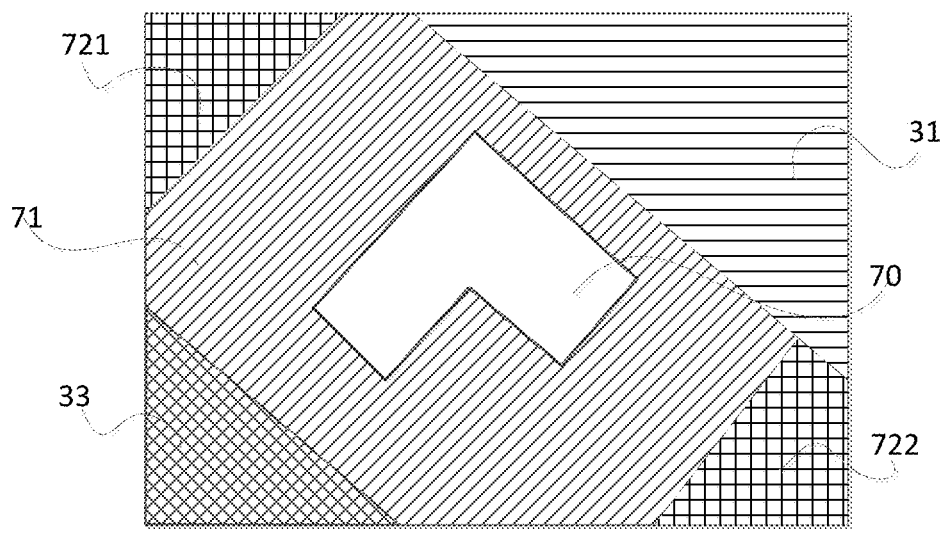
FIG. 4 is a schematic diagram of a partial region included in a driving circuit zone and a partial region included in a fan-out zone 31.

FIG. 4 shows a partial region included in the driving circuit zone, a partial region included in the fan-out zone 31 and a partial region included in the signal line region 33.

As shown in FIG. 4, the flat region may include a flat redundant driving circuit region 71, and the alignment mark region 70 is included in the flat redundant driving circuit region 71.

The flat redundant driving circuit region 71 may be included in the driving circuit zone. In addition to the flat redundant driving circuit region 71, the driving circuit zone may further include a first driving circuit region 721 and a second driving circuit region 722. The flat redundant driving circuit region 71 includes the alignment mark region 70.

The display panel includes the semiconductor layer, the first gate metal layer, the second gate metal layer, the source-drain metal layer and the anode layer sequentially arranged on the substrate.

At least one stage of redundant shift register unit is arranged in a region other than the alignment mark region 70 included in the flat redundant driving circuit region 71. An active driving circuit including a plurality of stages of shift register units are arranged in the first driving circuit region 721 and the second driving circuit region 722.

In the alignment mark region 70, all the semiconductor layer, the gate metal layer and the source-drain metal layer are hollowed out, such that the light transmittance of the alignment mark region 70 is much higher than that of a region close to the alignment mark region 70 included in the driving circuit zone, and thus the alignment camera may accurately identify the alignment mark region. Further, there is no need for a space dedicated for arranging an alignment mark, which may narrow the bezel of the display panel and achieve the precise alignment of process.

In the alignment mark region 70, the anode layer is not provided with the opening, and the anode layer is filled up. Thus, the alignment camera may identify the alignment mark region 70.

In a region other than the alignment mark region 70 included in the driving circuit zone, the anode layer may be provided with a plurality of spaced openings for venting of an organic film layer.

As shown in FIG. 4, the edge of the orthographic projection of the alignment mark region 70 onto the substrate may be, but not limited to, L-shaped. In a specific implementation, the edge of the orthographic projection of the alignment mark region 70 onto the substrate may also be of other shapes.

Figure 5A:
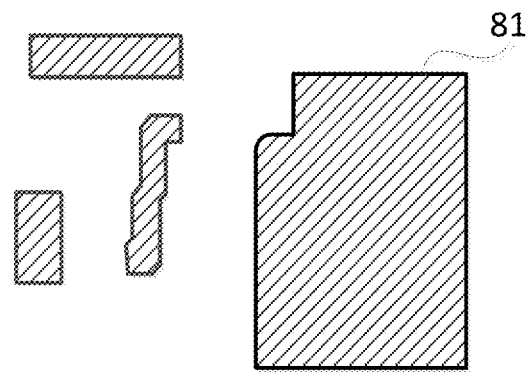
FIG. 5A is a top view of an embodiment of an active pattern 81 included in a semiconductor layer arranged on a substrate in a flat redundant driving circuit region.
Figure 5B:
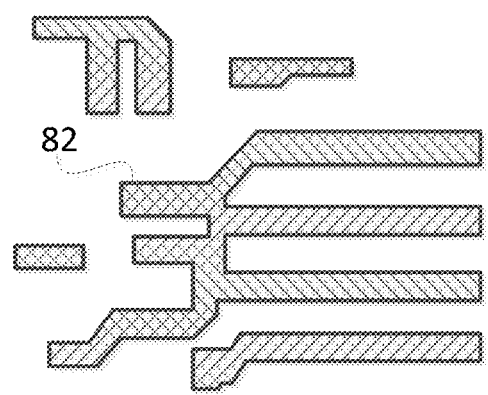
FIG. 5B is a top view of an embodiment of a first gate metal pattern 82 included in a first gate metal layer arranged above the semiconductor layer in the flat redundant driving circuit region.
Figure 5C:
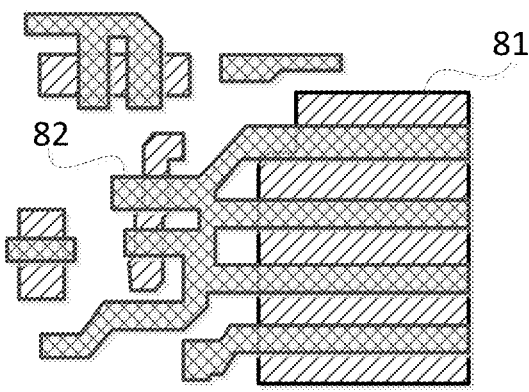
FIG. 5C is a schematic diagram of a case where
Figure 5D:
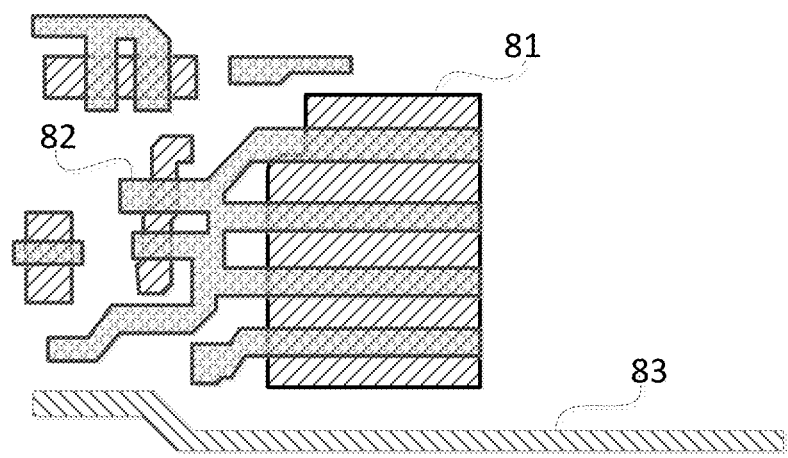
FIG. 5D is a schematic diagram of a case where a second gate metal pattern 83 included in a second gate metal layer is added on the basis of FIG. 5C in the flat redundant driving circuit region.
Figure 5E:
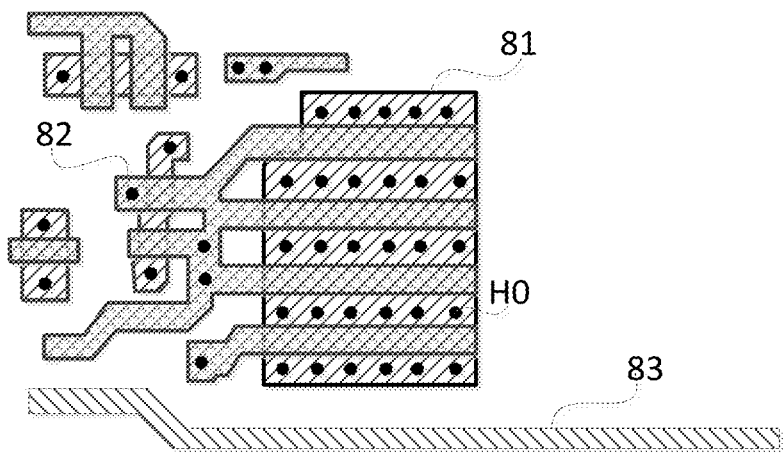
FIG. 5E is a schematic diagram of a case where a plurality of via holes H0 are arranged after the semiconductor layer, the first gate metal layer and the second gate metal layer are sequentially arranged in the flat redundant driving circuit region.
Figure 5F:
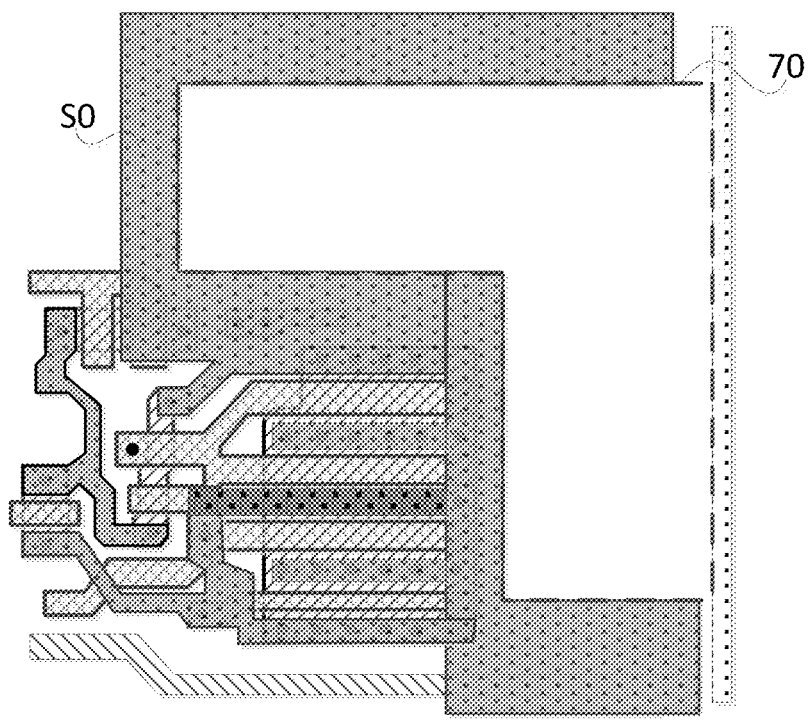
FIG. 5F is a schematic diagram of a case where a source-drain metal layer S0 is further arranged after the plurality of via holes H0 are arranged in the flat redundant driving circuit region.

FIG. 5A is a top view of at least one embodiment of an active pattern 81 included in a semiconductor layer arranged in a flat redundant driving circuit region on a substrate. FIG. 5B is a top view of at least one embodiment of a first gate metal pattern 82 included in a first gate metal layer arranged above the semiconductor layer in the flat redundant driving circuit region. FIG. 5C is a schematic diagram of a case where FIG. 5A and FIG. 5B are superimposed in the flat redundant driving circuit region. FIG. 5D is a schematic diagram of a case where a second gate metal pattern 83 included in a second gate metal layer is added on the basis of FIG. 5C in the flat redundant driving circuit region. FIG. 5E is a schematic diagram of a case where a plurality of via holes H0 are arranged after the semiconductor layer, the first gate metal layer and the second gate metal layer are sequentially arranged in the flat redundant driving circuit region. FIG. 5F is a schematic diagram of a case where a source-drain metal layer S0 is further arranged after the plurality of via holes H0 are arranged in the flat redundant driving circuit region. As shown in FIG. 5F, in the alignment mark region 70, all the first gate metal layer, the second gate metal layer, the semiconductor layer and the source-drain metal layer are hollowed out.

Figure 5G:
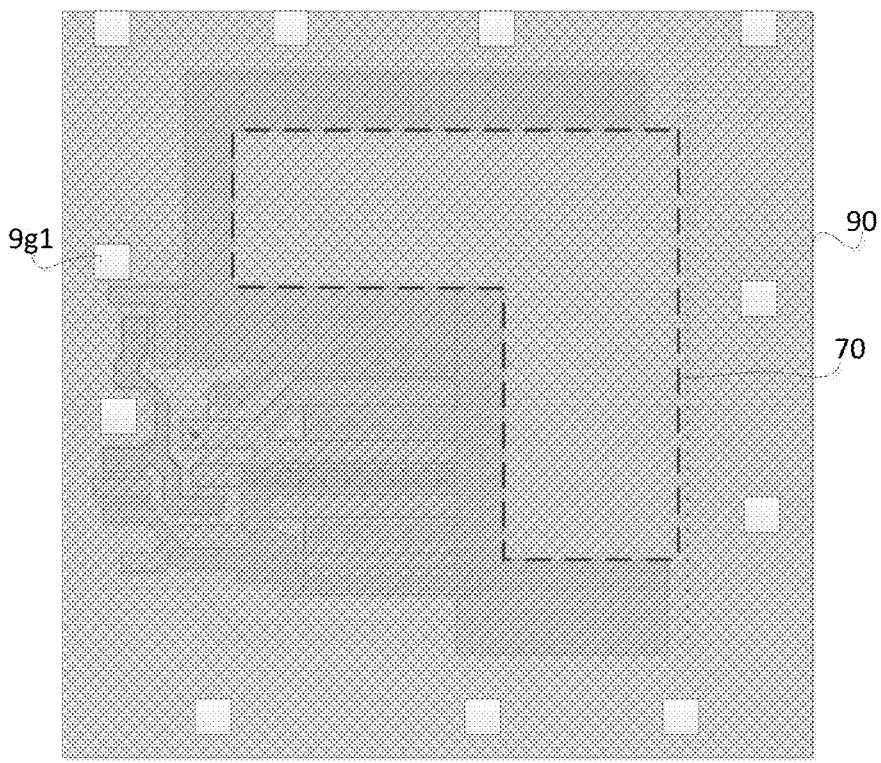
FIG. 5G is a schematic diagram of an embodiment where an anode layer 90 is arranged on the source-drain metal layer in the flat redundant driving circuit region.

FIG. 5G is a schematic diagram of a case where an anode layer 90 is arranged on the source-drain metal layer in the flat redundant driving circuit region. In the alignment mark region 70, the anode layer 90 is not provided with the opening, and the anode layer 90 is filled up, so that an alignment camera may identify the alignment mark region 70. In a region other than the alignment mark region 70, the anode layer 90 is provided with a plurality of openings 9g1.

In FIG. 5F and FIG. 5G, a region enclosed by the dotted line is the alignment mark region 70, the edge of the orthographic projection of the alignment mark region 70 onto the substrate is L-shaped, but the present disclosure is not limited thereto.

In the embodiment as shown in FIG. 5G, in the alignment mark region, an anode pattern included in the anode layer may be a whole piece of anode pattern.

Optionally, the display panel further includes an anode layer arranged on a surface of the source-drain metal layer away from the gate metal layer; and in the alignment mark region, the anode layer may be hollowed out as well.

Figure 5H:
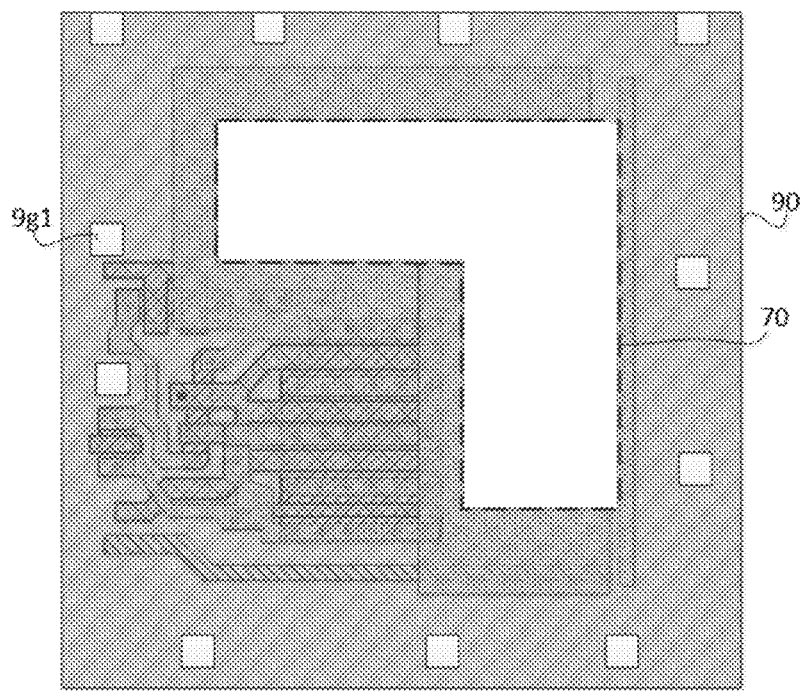
FIG. 5H is another schematic diagram of an embodiment where the anode layer 90 is arranged on the source-drain metal layer in the flat redundant driving circuit region.

As shown in FIG. 5H, the anode layer 90 is arranged on the source-drain metal layer in the flat redundant driving circuit region. In the embodiment corresponding to FIG. 5H, in the alignment mark region 70, the anode layer 90 is hollowed out to further increase the light transmittance of the alignment mark region, to form a strong contrast with other regions, so that alignment marking can be realized.

Optionally, the display panel further includes an anode layer arranged on a surface of the source-drain metal layer away from the gate metal layer; and in the alignment mark region, the anode layer is not provided with the opening, the anode layer is filled up, and the gate metal layer and the source-drain metal layer are hollowed out.

In at least one embodiment of the present disclosure, in the first region, the anode layer, the gate metal layer and the source-drain metal layer are hollowed out. The first region is a region surrounding the alignment mark region and included in the flat redundant driving circuit region.

In a specific implementation, in the alignment mark region, the anode layer is not provided with the opening, and the anode layer is filled up. In the first region, the anode layer, the gate metal layer and the source-drain metal layer are hollowed out. Thus, not only the light transmittance of the alignment mark region can be increased, but also a strong contrast with other regions can be formed as the whole piece of anode pattern with high reflectivity located in the alignment mark region reflects light, so that alignment marking can be realized.

Figure 5I:
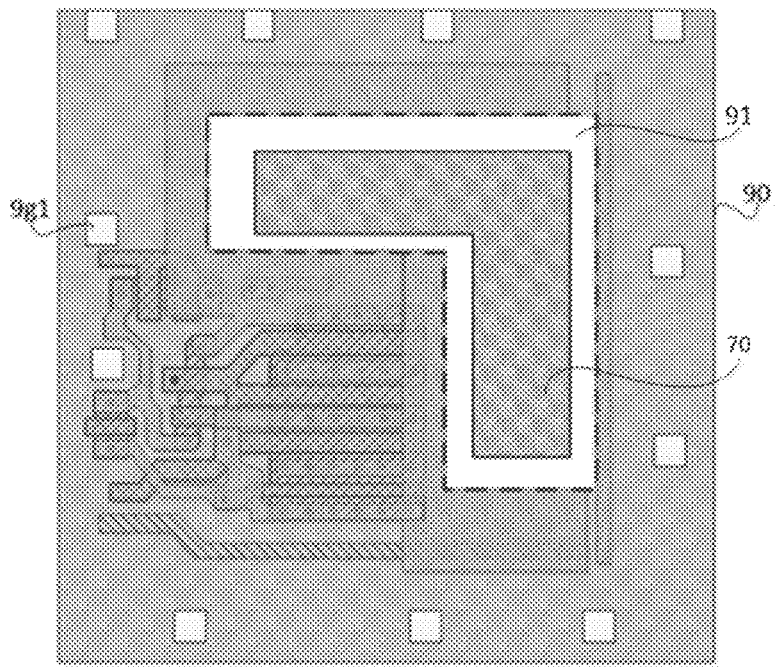
FIG. 5I is yet another schematic diagram of an embodiment where the anode layer 90 is arranged on the source-drain metal layer in the flat redundant driving circuit region.

As shown in FIG. 5I, the anode layer 90 is arranged on the source-drain metal layer in the flat redundant driving circuit region. In the alignment mark region 70, the anode layer 90 is filled up. A first region 91 around the alignment mark region 70 is provided. In the first region 91, the anode layer 90 is hollowed out.

Optionally, the display panel may further include an anode layer arranged on a surface of the source-drain metal layer away from the gate metal layer; and in the alignment mark region, the anode layer includes an alignment mark pattern.

In a specific implementation, the anode layer may include the alignment mark pattern arranged in the alignment mark region, so as to help the alignment camera to accurately capture the alignment mark pattern and perform alignment.

In at least one embodiment of the present disclosure, an orthographic projection of the alignment mark pattern onto the substrate may be of an L shape, a T shape or a polygonal shape, but the present disclosure is not limited thereto.

Figure 5J:
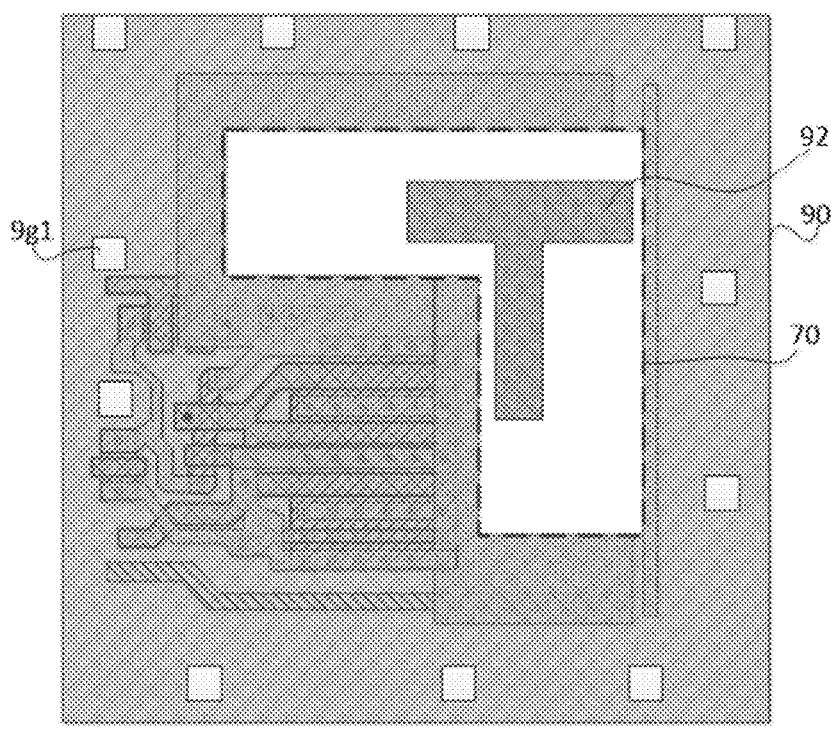
FIG. 5J is still another schematic diagram of an embodiment where the anode layer 90 is arranged on the source-drain metal layer in the flat redundant driving circuit region.

As shown in FIG. 5J, in the flat redundant driving circuit region, the anode layer 90 is arranged on the source-drain metal layer. In the alignment mark region 70, the anode layer 90 includes a T-shaped alignment mark pattern 92, so as to help the alignment camera to accurately capture the alignment mark pattern 92 and perform alignment.

In a specific implementation, a redundant driving circuit is arranged in the region other than the alignment mark region included in the flat redundant driving circuit region. The redundant driving circuit may include at least one output transistor.

In the embodiment of the present disclosure, as shown in FIG. 5A to FIG. 5F, in the alignment mark region, an active layer of the output transistor, a first gate metal layer of the output transistor, a second gate metal layer of the output transistor, and a source-drain metal layer may be all hollowed out, that is, the alignment mark region may be a region where the output transistor is originally arranged, but the present disclosure is not limited thereto.

In a specific implementation, in the flat redundant driving circuit region, a first insulation layer may be arranged between the semiconductor layer and the first gate metal layer, a second insulation layer may be arranged between the first gate metal layer and the second gate metal layer, a third insulation layer may be arranged between the second gate metal layer and the source-drain metal layer, and a fourth insulation layer may be arranged between the source-drain metal layer and the anode layer. Since a light transmittance of the first insulation layer, a light transmittance of the second insulation layer, a light transmittance of the third insulation layer and a light transmittance of the fourth insulation layer are relatively high, the first insulation layer, the second insulation layer, the third insulation layer and the fourth insulation layer in the alignment mark region may not be hollowed out.

In at least one embodiment of the present disclosure, the first insulation layer, the second insulation layer, the third insulation layer and the fourth insulation layer may be made of silicon oxide or silicon nitride, but the present disclosure is not limited thereto.

In a specific implementation, the redundant driving circuit includes a plurality of stages of redundant shift register units, and the plurality of stages of redundant shift register units are not coupled to the pixel units.

In at least one embodiment of the present disclosure, the shift register units included in the redundant driving circuit are not coupled to the pixel units in the display region.

In at least one embodiment of the present disclosure, at least one stage of the plurality of stages of redundant shift register units includes the alignment mark regions, and the at least one stage of the plurality of stages of redundant shift register units is different from other redundant shift register units. Other redundant shift register units are redundant shift register units other than the at least one stage of redundant shift register unit included in the redundant driving circuit.

In at least one embodiment of the present disclosure, the active driving circuit may include a plurality of stages of shift register units. The shift register units are coupled to corresponding rows of pixel units, and are configured to supply a gate driving signal and/or a light-emission control signal to the corresponding rows of pixel units.

In at least one embodiment of the present disclosure, the active driving circuit may be arranged in the driving circuit region. The shift register units included in the active driving circuit are configured to supply a gate driving signal and/or a light-emission control signal to the corresponding rows of pixel units in the display region.

Optionally, in the alignment mark regions, at least one film layer included in the output transistor of the redundant driving circuit is hollowed out.

Optionally, the redundant driving circuit may include a redundant gate driving circuit and a redundant light-emission control circuit. The redundant light-emission control circuit is arranged on a side of the redundant gate driving circuit away from the display region, and includes a redundant light-emission control signal output line; in the alignment mark regions, the redundant light-emission control signal output line is hollowed out.

Optionally, in a region other than the alignment mark regions included in the redundant driving circuit region, a first electrode plate of a storage capacitor is arranged. In the region other than the alignment mark regions included in the redundant driving circuit region, a second electrode plate of the storage capacitor is not coupled to an output transistor included in the redundant driving circuit.

In FIG. 6A, FIG. 6B, FIG. 6C, FIG. 6D, FIG. 6E, FIG. 6F, FIG. 6G, FIG. 6H and FIG. 6I, 61 denotes a partial region included in the flat redundant driving circuit region, 70 denotes the alignment mark region, and 62 denotes a partial region included in the driving circuit region.

Figure 6A:
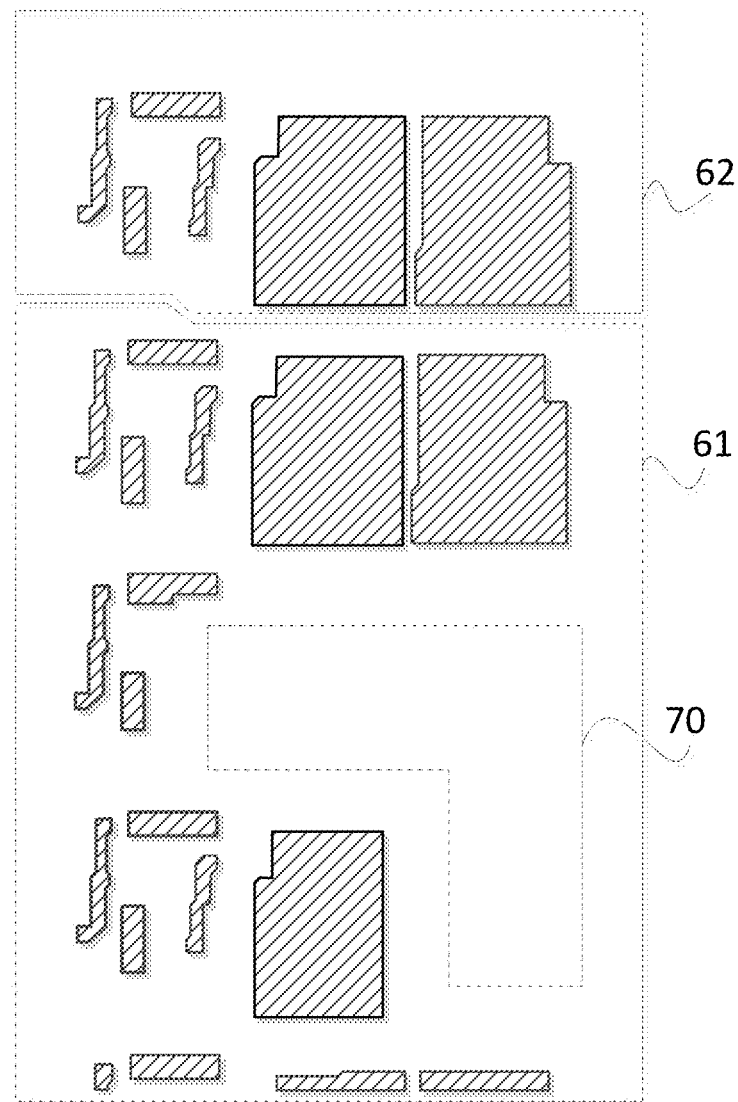
FIG. 6A is a schematic diagram of an active layer pattern.
Figure 6B:
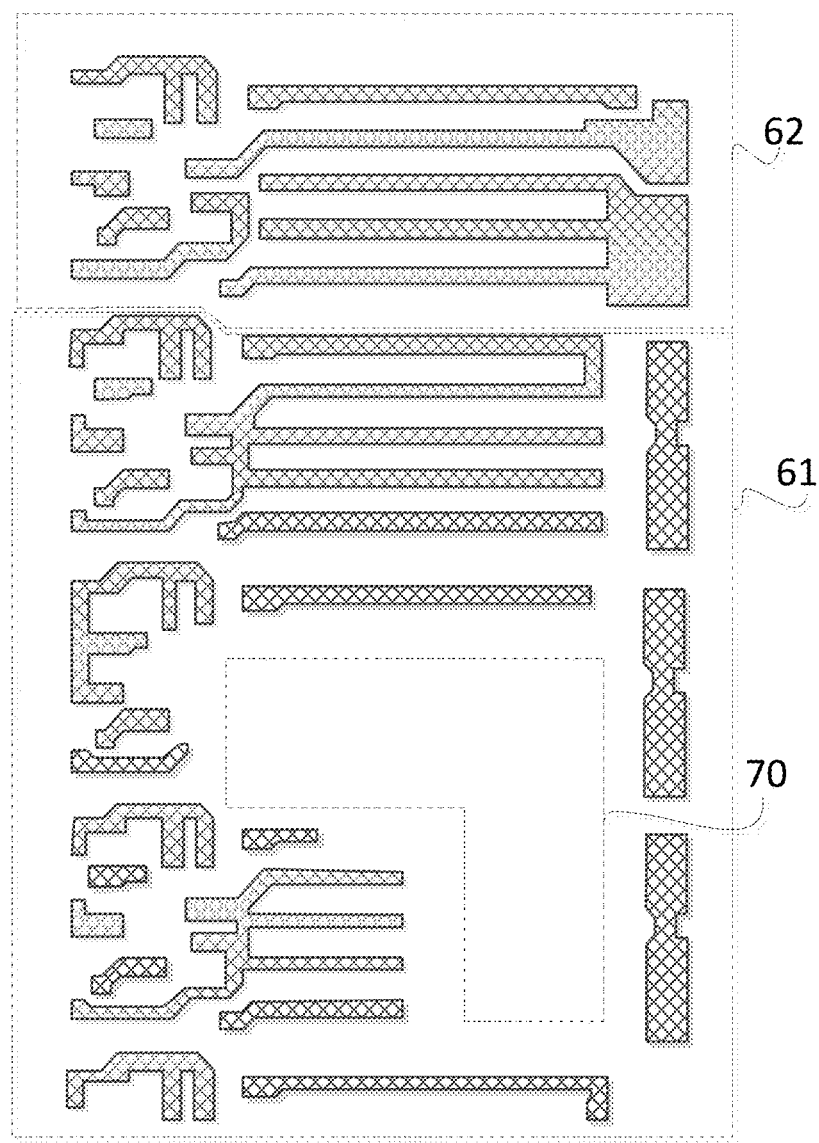
FIG. 6B is a schematic diagram of a first gate metal pattern included in a first gate metal layer.
Figure 6C:
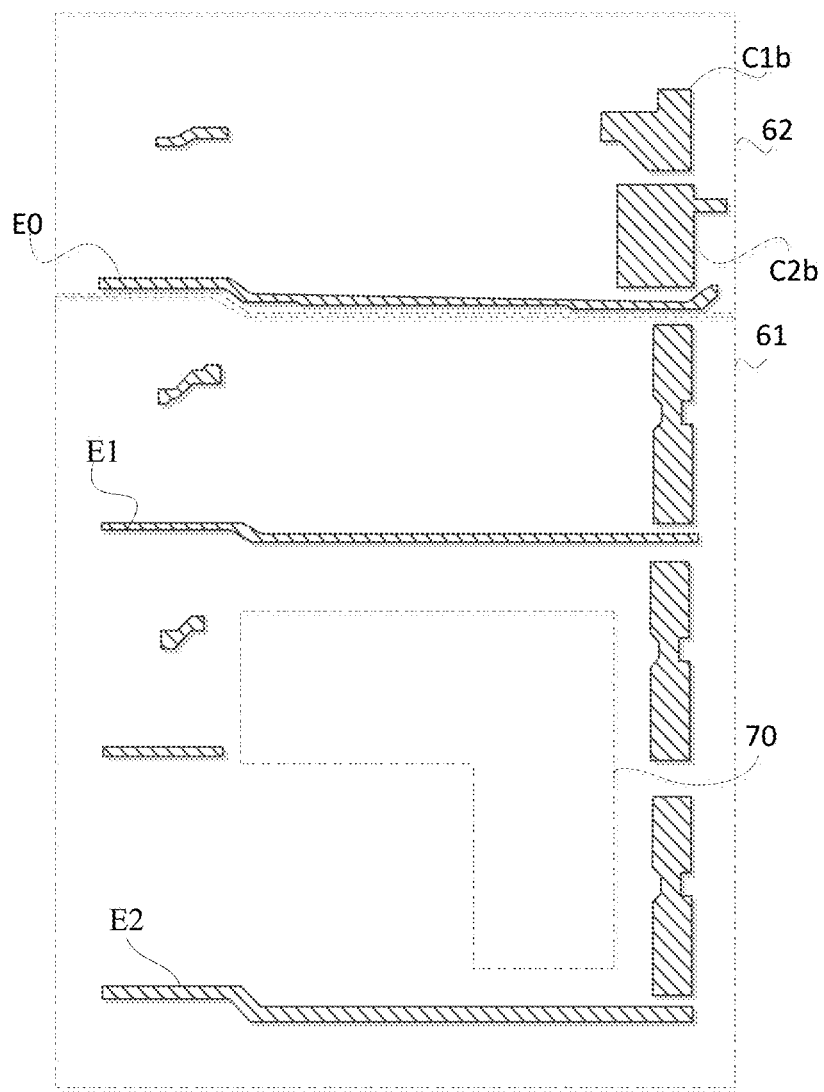
FIG. 6C is a schematic diagram of a second gate metal pattern included in a second gate metal layer.
Figure 6D:
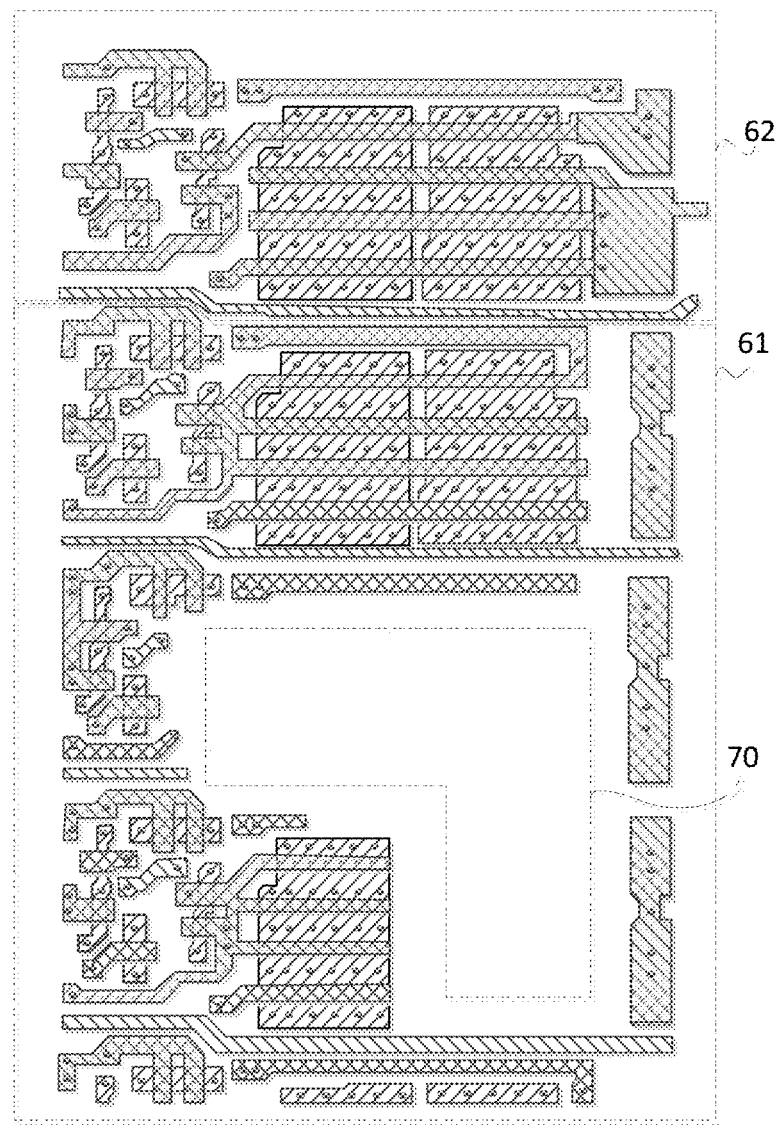
FIG. 6D is a schematic diagram of a case where via holes are further arranged after
Figure 6E:
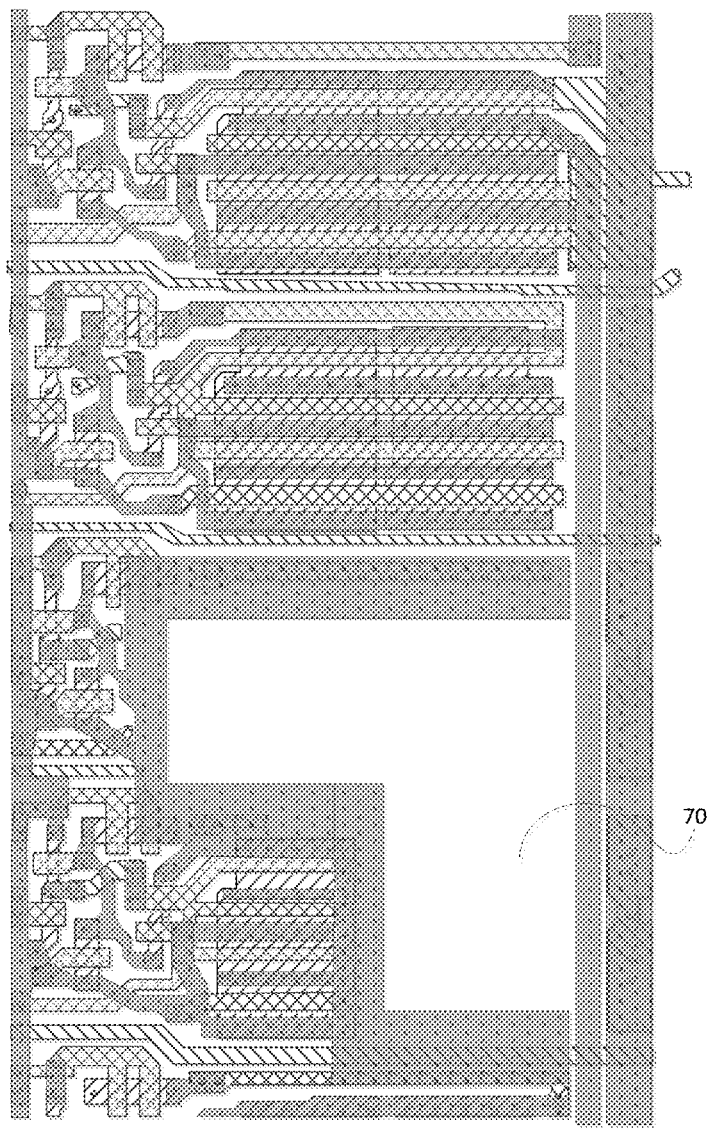
FIG. 6E is a schematic diagram of a case where a source-drain metal layer is further arranged on a superimposed diagram shown in FIG. 6D.
Figure 6F:
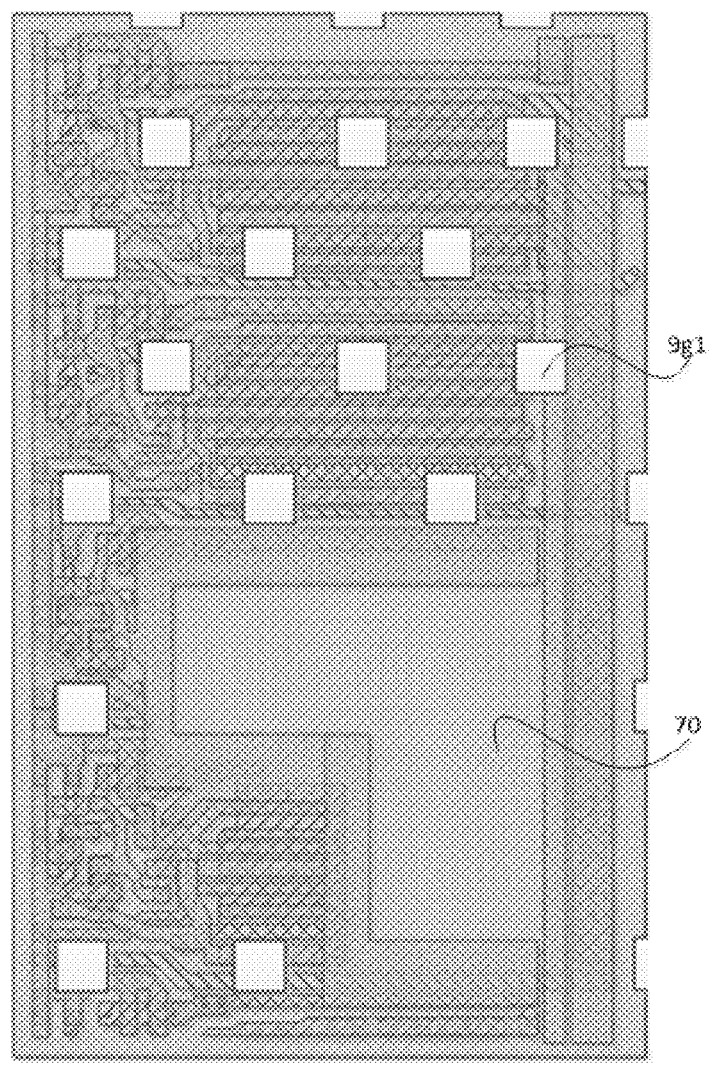
FIG. 6F is a schematic diagram of a case where an anode layer is further arranged on the basis of FIG. 6E.

FIG. 6A is a schematic diagram of an active layer pattern. FIG. 6B is a schematic diagram of a first gate metal pattern included in a first gate metal layer. FIG. 6C is a schematic diagram of a second gate metal pattern included in a second gate metal layer. FIG. 6D is a schematic diagram of a case where via holes are further arranged after FIG. 6A, FIG. 6B, and FIG. 6C are superimposed. FIG. 6E is a schematic diagram of a case where a source-drain metal layer is further arranged on a superimposed diagram shown in FIG. 6D. FIG. 6F is a schematic diagram of a case where an anode layer is further arranged on the basis of FIG. 6E. As shown in FIG. 6F, in the alignment mark region 70, the anode layer is not provided with the opening, so as to help an alignment camera to identify the alignment mark region 70. In the region other than the alignment mark region 70, the anode layer may be provided with the plurality of openings 9g1.

Figure 6G:
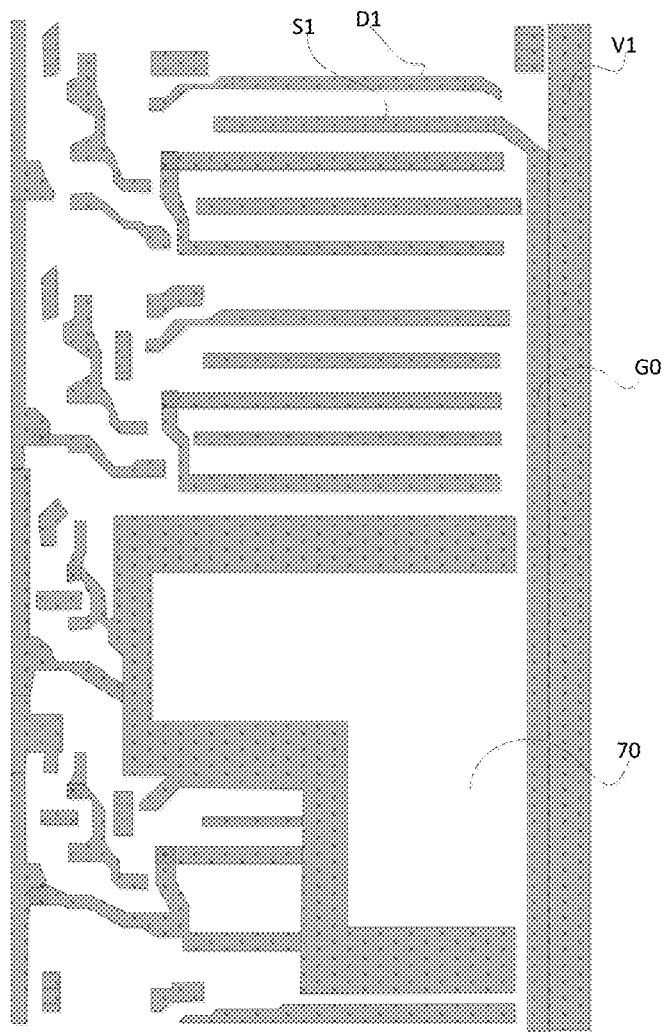
FIG. 6G is a schematic diagram of the source-drain metal layer in FIG. 6E.

FIG. 6G is a schematic diagram of the source-drain metal layer in FIG. 6E.

In the embodiment corresponding to FIG. 6A to FIG. 6I, the active driving circuit may include a gate driving signal output line, a first storage capacitor, a second storage capacitor, a first output transistor and a second output transistor, and is configured to supply a gate driving signal. A first electrode of the first output transistor may be coupled to the gate driving signal line. The first electrode of the first output transistor may be reused as a first electrode of the second output transistor, and the first electrode may be a source electrode or a drain electrode. A first electrode plate of the first storage capacitor is coupled to a gate electrode of the first output transistor, a first electrode plate of the second storage capacitor is coupled to a gate electrode of the second output transistor, a second electrode plate of the first storage capacitor is coupled to a first voltage signal line, and a second electrode plate of the second storage capacitor is coupled to the gate driving signal line.

In at least one embodiment of the present disclosure, the first output transistor may be configured to control a first voltage signal output through the gate driving signal line, and the second output transistor may be configured to control a second voltage signal output through the gate driving signal line, but the present disclosure is not limited thereto.

Optionally, the first voltage signal may be a high voltage signal, and the second voltage signal may be a low voltage signal, but the present disclosure is not limited thereto.

In FIG. 6G, G0 denotes the gate driving signal output line, and V1 denotes the first voltage signal line. In FIG. 6C, E0 denotes a light-emission control signal output line in the partial region 62 included in the driving circuit region. As shown in FIG. 6G, the gate driving signal output line G0 is coupled to the first electrode S1 of the first output transistor. In FIG. 6G, D1 denotes a second electrode included in the first output transistor.

In FIG. 6C, in the partial region 61 included in the flat redundant driving circuit region, E1 denotes a first redundant light-emission control signal output line, and E2 denotes a second redundant light-emission control signal output line. In a region other than the alignment mark region 70 in the partial region 61 of the flat redundant driving circuit region, the first redundant light-emission control signal output line E1 and the second redundant light-emission control signal output line E2 extend along a first direction in the partial region 61 included in the flat redundant driving circuit region. However, the first redundant light-emission control signal output line E1 and the second redundant light-emission control signal output line E2 are not coupled to the pixel units located in the display region. In at least one embodiment of the present disclosure, the first direction may be a horizontal direction, but the present disclosure is not limited thereto.

In FIG. 6G, S1 is reused as an electrode pattern included in a second electrode of the second output transistor.

In at least one embodiment of the present disclosure, the first electrode is a source electrode or a drain electrode, and the second electrode may be a drain electrode or a source electrode.

Figure 6H:
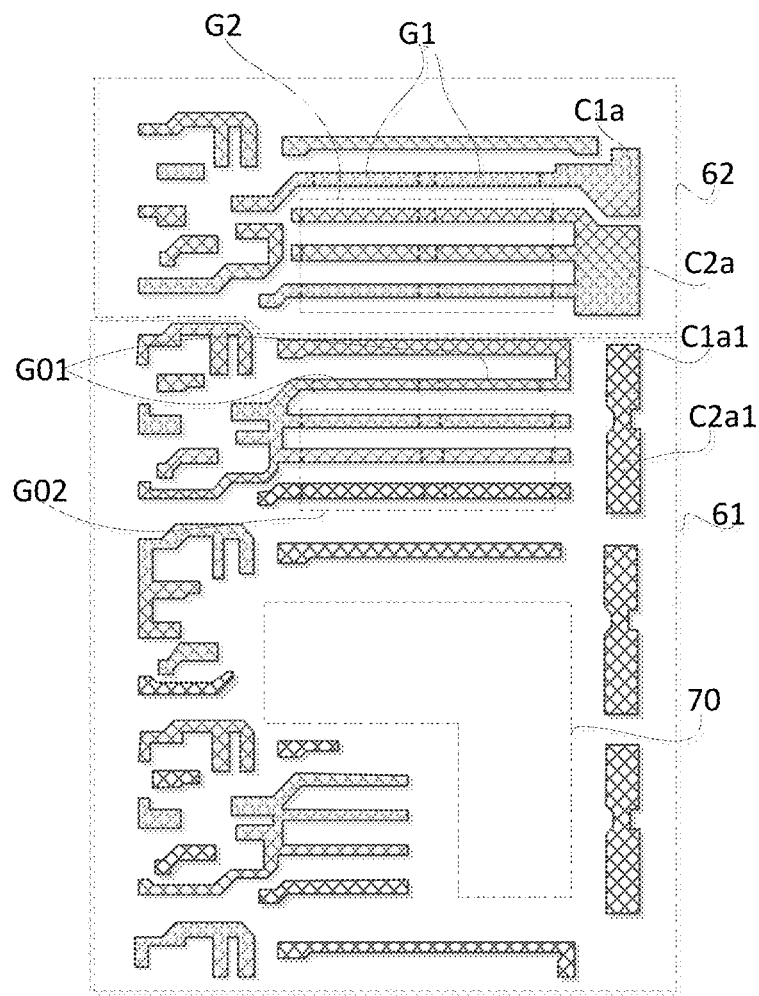
FIG. 6H is a schematic diagram in which reference numerals are added on the basis of FIG. 6B.

As shown in FIG. 6H, on the basis of FIG. 6B, C1a denotes the first electrode plate of the first storage capacitor, C2a denotes the first electrode plate of the second storage capacitor, G1 denotes the gate electrode of the first output transistor, and G2 denotes the gate electrode of the second output transistor. G1 is coupled to C1a, and G2 is coupled to C2a.

Figure 6I:
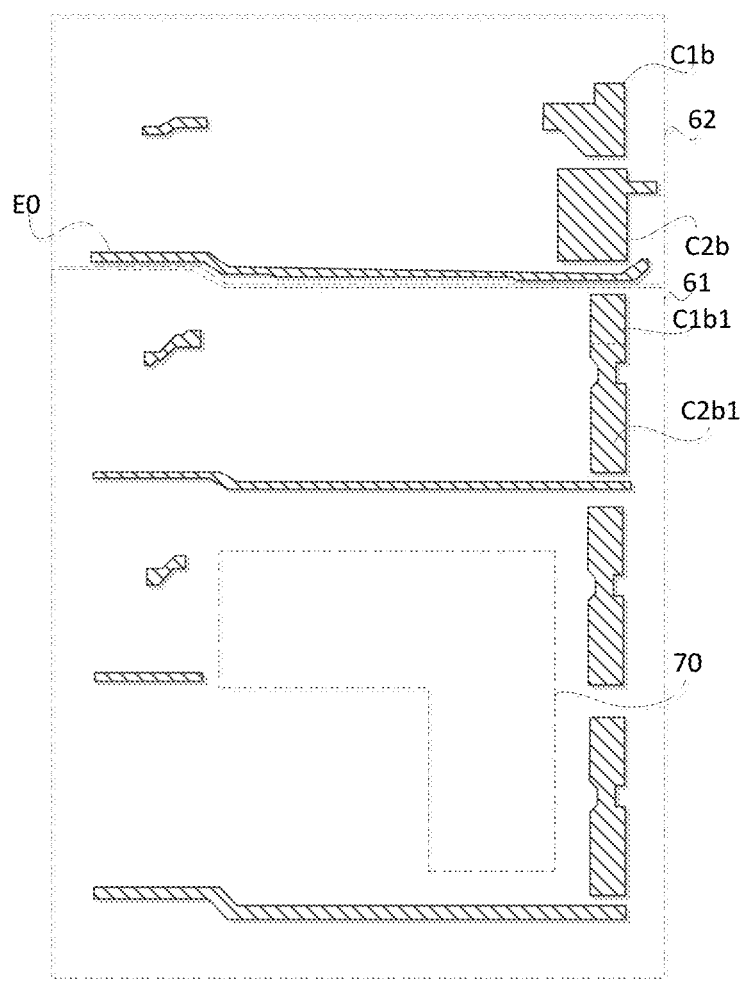
FIG. 6I is a schematic diagram in which reference numerals are added on the basis of FIG. 6C.

As shown in FIG. 6I, on the basis of FIG. 6C, C1b denotes the second electrode plate of the first storage capacitor, and C2b denotes the second electrode plate of the second storage capacitor. As shown in FIG. 6A to FIG. 6I, the second electrode plate C1b of the first storage capacitor is coupled to the first voltage signal line V1 through a via hole, and the second electrode plate C2b of the second storage capacitor is coupled to the gate driving signal output line G0 through a via hole.

In the embodiment corresponding to FIG. 6A to FIG. 6I, in the partial region 62 included in the driving circuit region, the light-emission control signal output line E0 passes through the shift register unit included in the gate driving circuit transversely to supply a light-emission control signal to the pixel units in the display region.

As shown in FIG. 6A to FIG. 6I, the redundant driving circuit is arranged in the region other than the alignment mark region in the redundant driving circuit region, and the active driving circuit is arranged in the driving circuit region. The first output transistor and the second output transistor are also arranged in the redundant driving circuit. As shown in FIG. 6H, G01 denotes the gate electrode of the first output transistor in the redundant driving circuit in the partial region 61 included in the flat redundant driving circuit region, and G02 denotes the gate electrode of the second output transistor in the redundant driving circuit in the partial region 61 included in the flat redundant driving circuit region.

A difference between a structure of the redundant driving circuit and a structure of the active driving circuit is as follows.

As shown in FIG. 6H, C1a1 denotes the first electrode plate of the first storage capacitor in the redundant driving circuit, and C2a1 denotes the first electrode plate of the second storage capacitor in the redundant driving circuit. In the redundant driving circuit, C1a1 and C2al are coupled to each other, C1a1 is not coupled to G01, and C2al is not coupled to G02. An area of C1a1 is smaller than that of C1a, and an area of C2al is smaller than that of C2a.

As shown in FIG. 6I, C1b1 denotes the first electrode plate of the first storage capacitor in the redundant driving circuit, and C2b1 denotes the first electrode plate of the second storage capacitor in the redundant driving circuit. In the redundant driving circuit, C1b1 and C2b1 are coupled to each other, and C2b1 is not coupled to the gate driving signal output line. An area of C1b1 is smaller than that of C1b, and an area of C2b1 is smaller than that of C2b.

As shown in FIG. 6D, an orthographic projection of C1b onto the substrate may overlap an orthographic projection of C1b1 onto the substrate, and an orthographic projection of C2b onto the substrate may overlap an orthographic projection of C2b1 onto the substrate.

As shown in FIG. 6A to FIG. 6I, in the alignment mark region 70, the electrode layer of at least one output transistor in the redundant driving circuit and the active layer of the at least one output transistor are hollowed out. Further, in the alignment mark region 70, the redundant light-emission control signal output line is hollowed out.

Specifically, as shown in FIG. 6E, in the alignment mark region 70, the electrode layers and the active layers of some elements in two stages of redundant shift register units included in the redundant driving circuit are hollowed out.

In the alignment mark region 70, an electrode layer of the first output transistor, an active layer of the first output transistor, an electrode layer of the second output transistor and an active layer of the second output transistor in a first-stage redundant shift register unit included in the redundant driving circuit are hollowed out.

In the alignment mark region 70, a right half of an electrode layer of the first output transistor, a right half of an active layer of the first output transistor, a right half of an electrode layer of the second output transistor and a right half of an active layer of the second output transistor in a second-stage redundant shift register unit included in the redundant driving circuit are hollowed out.

In addition, in the alignment mark region 70, the redundant light-emission control signal output line between the first-stage redundant shift register unit and the second-stage redundant shift register unit included in the redundant driving circuit is hollowed out.

As shown in FIG. 6A, in order to prevent the self-heating effect caused by an excessively large area of the active layer pattern from harming the transistor characteristic, an active layer pattern of the first output transistor is divided into left and right parts, and an active layer pattern of the second output transistor is also divided into left and right parts.

In a specific implementation, in the flat redundant driving circuit region and the driving circuit region, the redundant driving circuit and the active driving circuit are formed simultaneously.

First, in the driving circuit zone, the semiconductor layer is formed on the substrate, and one patterning process is performed on the semiconductor layer, to form an active layer of each transistor in the redundant driving circuit, to hollow out the semiconductor layer in the alignment mark region 70, and to form the active layer of each transistor in the active driving circuit. A first insulation layer is formed on a surface of the active layer away from the substrate.

Then, in the driving circuit zone, the first gate metal layer is formed on a surface of the semiconductor layer away from the substrate, and one patterning process is performed on the first gate metal layer, to form a gate electrode of each transistor and a first electrode plate of each capacitor in the redundant driving circuit, to form a gate electrode of each transistor and a first electrode plate of each capacitor in the active driving circuit, and to hollow out the first gate metal layer in the alignment mark region 70.

Using the gate electrodes of the transistors as a mask, parts of the active layer not covered by the gate electrodes are doped, such that the parts of the active layer not covered by the gate electrodes form conductive parts, and parts of the active layer covered by the gate electrodes form channel parts. The conductive part is used as an input electrode or an output electrode of a transistor; or the conductive part is coupled to the input electrode or the output electrode of the transistor.

A second insulation layer is arranged on a surface of the first gate metal layer away from the first insulation layer. A second gate metal layer is arranged on a surface of the second insulation layer away from the first gate metal layer, and one patterning process is performed on the second gate metal layer to form a second electrode plate of each capacitor in the redundant driving circuit, an output signal line in the redundant driving circuit, a second electrode plate of each capacitor in the active driving circuit and an output signal line in the active driving circuit, and to hollow out the second gate metal layer in the alignment mark region 70.

A third insulation layer is arranged on a surface of the second gate metal layer away from the second insulation layer. A plurality of via holes are arranged on the substrate provided with the active layer, the first insulation layer, the first gate metal layer, the second insulation layer, the second gate metal layer and the third insulation layer.

A source-drain metal layer is arranged on a surface of the third insulation layer away from the second gate metal layer, and the source-drain metal layer is patterned to form a signal line and a conductive connection part, and to hollow out the source-drain metal layer in the alignment mark region 70.

A fourth insulation layer is arranged on a surface of the source-drain metal layer away from the third insulation layer. An anode layer is arranged on a surface of the fourth insulation layer away from the source-drain metal layer. In the alignment mark region 70, the anode layer is not provided with an opening, so that an alignment camera may identify the alignment mark region 70. In a region other than the alignment mark region 70 in the driving circuit zone, the anode layer 90 is provided with the plurality of openings 9g1.

In at least one embodiment of the present disclosure, the number of the source-drain metal layers may be two, and a first source-drain metal layer, a fifth insulation layer, a second source-drain metal layer, a sixth insulation layer and the anode layer may be sequentially arranged on the surface of the third insulation layer away from the second gate metal layer. In the alignment mark region, both the first source-drain metal layer and the second source-drain metal layer may be hollowed out, and the insulation layers may not be hollowed out.

A method for manufacturing a display panel according to at least one embodiment of the present disclosure is used to manufacture the display panel. The display panel includes a display region and a peripheral region arranged on a substrate. The peripheral region includes a region between the display region and an edge of the display panel, and includes a flat region and a curved region. The flat region includes a flat redundant driving circuit region. The method for manufacturing the display panel includes: arranging a plurality of pixel units in the display region, and arranging a plurality of active driving circuits and a plurality of redundant driving circuits in the peripheral region; arranging at least part of the redundant driving circuits in the flat redundant driving circuit region, where each of the redundant driving circuits includes one or more electrode layers arranged on the substrate; arranging alignment mark regions in the flat redundant driving circuit region; and in the alignment mark regions, hollowing out at least one of the electrode layers, and/or filling up at least one of the electrode layers. A minimum distance between edges of orthographic projections of two adjacent alignment mark regions of the alignment mark regions onto the substrate is an alignment mark distance, and at least one alignment mark distance is larger than a predetermined alignment mark distance.

In the method for manufacturing the display panel according to at least one embodiment of the present disclosure, the alignment mark regions are provided in the flat redundant driving circuit region. In each of the alignment mark regions, at least one of the electrode layers is hollowed out, such that a light transmittance of the alignment mark region is larger than a light transmittance of a surrounding region, thus accurate alignment marking may be realized; and/or, in each of the alignment mark regions, at least one of the electrode layers is filled up, and a strong contrast with other regions may be formed as the electrode layer reflects light, thus alignment marking may be realized.

In at least one embodiment of the present disclosure, the surrounding region may be a region included in the peripheral region that is closer to the alignment mark region.

Optionally, the predetermined alignment mark distance is 10 times of a maximum pixel edge length. The maximum pixel edge length is a maximum value among pixel edge lengths of the plurality of pixel units, and the pixel edge length of a pixel unit is a length of an edge of an orthographic projection of the pixel unit onto the substrate.

Optionally, an area of an orthographic projection of each of the alignment mark regions onto the substrate may be larger than a predetermined area, and the predetermined area is a maximum pixel area. The maximum pixel area is a maximum value among pixel areas of the plurality of pixel units, and the pixel area of a pixel unit is an area of an orthographic projection of the pixel unit onto the substrate.

Optionally, the redundant driving circuit further includes at least one semiconductor layer arranged on the substrate, and the method for manufacturing the display panel further includes: in each of the alignment mark regions, hollowing out the at least one semiconductor layer, or filling up the at least one semiconductor layer.

In a specific implementation, the redundant driving circuit may further include the semiconductor layer. In each of the alignment mark regions, the semiconductor layer is hollowed out or filled up. In each of the alignment mark regions, in a case that the semiconductor layer is hollowed out, the light transmittance of the alignment mark region is further increased, so that accurate alignment marking may be performed.

Optionally, in each of the alignment mark regions, at least one electrode layer is filled up, and the method for manufacturing the display panel further includes: in the first region, hollowing out the electrode layer, and the first region is a region included in the flat redundant driving circuit region and surrounding the alignment mark region.

In a specific implementation, there is the first region around the alignment mark region. In the alignment mark region, at least one of the electrode layers is filled up, and in the first region, the electrode layer is hollowed out, thus not only the light transmittance of the alignment mark region can be increased, but also a strong contrast with other regions can be formed as the at least one electrode layer in the alignment mark region reflects light, so that alignment marking can be realized.

In a specific implementation, in the flat region, a surface of the display panel is flat.

Optionally, the display panel includes an upper surface, a lower surface, a first side surface, a second side surface, a third side surface and a fourth side surface. All the first side surface, the second side surface, the third side surface and the fourth side surface are curved side surfaces. An orthographic projection of the first side surface onto a first plane does not overlap an orthographic projection of the flat region onto the first plane. An orthographic projection of the second side surface onto the first plane does not overlap the orthographic projection of the flat region onto the first plane. An orthographic projection of the third side surface onto the first plane does not overlap the orthographic projection of the flat region onto the first plane. An orthographic projection of the fourth side surface onto the first plane does not overlap the orthographic projection of the flat region onto the first plane. The first plane is parallel to the lower surface.

In at least one embodiment of the present disclosure, the first side surface may be the left side surface, the second side surface may be the lower side surface, the third side surface may be the upper side surface, and the fourth side surface may be the right side surface. The display panel may further include a circuit board arranged on the lower surface, and the circuit board is arranged at a lower side edge of the display panel. A longest distance between an orthographic projection of each of the alignment mark regions onto the first plane and a lower left rounded corner of an orthographic projection of the display region boundary of the display panel onto the first plane is smaller than a predetermined distance, a longest distance between the orthographic projection of each of the alignment mark regions onto the first plane and a lower right rounded corner of the orthographic projection of the display region boundary of the display panel onto the first plane is smaller than the predetermined distance.

In a specific implementation, the predetermined distance may be determined according to the actual situation. For example, the predetermined distance may be greater than or equal to 300 microns and less than or equal to 1100 microns, but the present disclosure is not limited thereto.

In at least one embodiment of the present disclosure, in the case that the circuit board is arranged at the lower side edge of the display panel, the alignment mark region may be arranged close to the lower left rounded corner of the display region boundary, and/or, close to the lower right rounded corner of the display region boundary.

In at least one embodiment of the present disclosure, the first side surface may be the left side surface, the second side surface may be the lower side surface, the third side surface may be the upper side surface, and the fourth side surface may be the right side surface. The display panel may further include the circuit board arranged on the lower surface, and the circuit board is arranged at the upper side edge of the display panel. A longest distance between an orthographic projection of each of the alignment mark regions onto the first plane and an upper left rounded corner of an orthographic projection of a display region boundary of the display panel onto the first plane is smaller than a predetermined distance, a longest distance between the orthographic projection of each of the alignment mark regions onto the first plane and an upper right rounded corner of the orthographic projection of the display region boundary of the display panel onto the first plane is smaller than the predetermined distance.

In a specific implementation, the predetermined distance may be determined according to the actual situation. For example, the predetermined distance may be greater than or equal to 300 microns and less than or equal to 1100 microns, but the present disclosure is not limited thereto.

In at least one embodiment of the present disclosure, in the case that the circuit board is arranged at the upper side edge of the display panel, the alignment mark region may be arranged close to the upper left rounded corner of the display region boundary, and/or, close to the upper right rounded corner of the display region boundary.

In at least one embodiment of the present disclosure, the first side surface may be the left side surface, the second side surface may be the lower side surface, the third side surface may be the upper side surface, and the fourth side surface may be the right side surface. The display panel further includes the circuit board arranged on the lower surface, and the circuit board is arranged at the lower side edge of the display panel. A longest distance between an orthographic projection of each of the alignment mark regions onto the first plane and an upper left rounded corner of an orthographic projection of a display region boundary of the display panel onto the first plane is smaller than a predetermined distance, and/or, a longest distance between the orthographic projection of each of the alignment mark regions onto the first plane and an upper right rounded corner of the orthographic projection of the display region boundary of the display panel onto the first plane is smaller than the predetermined distance.

In a specific implementation, the predetermined distance may be determined according to the actual situation. For example, the predetermined distance may be greater than or equal to 300 microns and less than or equal to 1100 microns, but the present disclosure is not limited thereto.

In at least one embodiment of the present disclosure, in the case that the circuit board is arranged at the lower side edge of the display panel, the alignment mark region may be arranged close to the upper left rounded corner of the display region boundary, and/or, close to the upper right rounded corner of the display region boundary.

In at least one embodiment of the present disclosure, the first side surface may be the left side surface, the second side surface may be the lower side surface, the third side surface may be the upper side surface, and the fourth side surface may be the right side surface. The display panel further includes the circuit board arranged on the lower surface, and the circuit board is arranged at the upper side edge of the display panel. A longest distance between an orthographic projection of each of the alignment mark regions onto the first plane and a lower left rounded corner of an orthographic projection of a display region boundary of the display panel onto the first plane is smaller than a predetermined distance, and/or, a longest distance between the orthographic projection of each of the alignment mark regions onto the first plane and a lower right rounded corner of the orthographic projection of the display region boundary of the display panel onto the first plane is smaller than the predetermined distance.

In a specific implementation, the predetermined distance may be determined according to the actual situation. For example, the predetermined distance may be greater than or equal to 300 microns and less than or equal to 1100 microns, but the present disclosure is not limited thereto.

In at least one embodiment of the present disclosure, in the case that the circuit board is arranged at the upper side edge of the display panel, the alignment mark region may be arranged close to the lower left rounded corner of the display region boundary, and/or, close to the lower right rounded corner of the display region boundary.

According to a specific implementation, arranging the alignment mark regions in the flat region of the peripheral region of the display panel may include: in the flat redundant driving circuit region, arranging the semiconductor layer on the substrate, and performing a patterning process on the semiconductor layer to form an active pattern; arranging a gate metal layer on the surface of the semiconductor layer away from the substrate, and performing a patterning process on the gate metal layer to form a gate metal pattern, and to hollow out the gate metal layer in the alignment mark regions; arranging the source-drain metal layer on a surface of the gate metal layer away from the semiconductor layer, and performing a patterning process on the source-drain metal layer to form a source-drain metal pattern, and to hollow out the source-drain metal layer in the alignment mark regions.

According to another specific implementation, the arranging the alignment mark regions in the flat region of the peripheral region of the display panel includes: in the flat redundant driving circuit region, arranging the semiconductor layer on the substrate, and performing a patterning process on the semiconductor layer to form an active pattern, and to hollow out the semiconductor layer in the alignment mark region; arranging a gate metal layer on the surface of the semiconductor layer away from the substrate, and performing a patterning process on the gate metal layer to form a gate metal pattern, and to hollow out the gate metal layer in the alignment mark regions; arranging the source-drain metal layer on a surface of the gate metal layer away from the semiconductor layer, and performing a patterning process on the source-drain metal layer to form a source-drain metal pattern, and to hollow out the source-drain metal layer in the alignment mark region.

In a specific implementation, the alignment mark regions may be included in the flat redundant driving circuit region. Except for the alignment mark regions, the circuit wiring is dense in the peripheral region close to the alignment mark regions. Since the wiring is opaque to visible light, under a certain backlight condition, the wiring may appear black in the field of view of the alignment camera. In contrast, there is no wiring arranged in the alignment mark regions, the backlight may almost completely pass through the alignment mark regions and enter the alignment camera, thereby a strong contrast with the surrounding region is formed. As a result, the alignment camera may identify the alignment mark regions.

The display device according to at least one embodiment of the present disclosure may include the display panel according to the embodiment of the present disclosure.

In a specific implementation, the display panel may include an upper surface, a lower surface, a first side surface, a second side surface, a third side surface and a fourth side surface. All the first side surface, the second side surface, the third side surface and the fourth side surface are curved side surfaces. An orthographic projection of the first side surface onto a first plane does not overlap an orthographic projection of the flat region onto the first plane. An orthographic projection of the second side surface onto the first plane does not overlap the orthographic projection of the flat region onto the first plane. An orthographic projection of the third side surface onto the first plane does not overlap the orthographic projection of the flat region onto the first plane. An orthographic projection of the fourth side surface onto the first plane does not overlap the orthographic projection of the flat region onto the first plane; and the first plane is parallel to the lower surface. The first side surface is a left side surface, the second side surface is a lower side surface, the third side surface is an upper side surface, and the fourth side surface is a right side surface. The display panel further includes a circuit board arranged on the lower surface, and the circuit board is arranged at a lower side edge or an upper side edge of the display panel. The display device further includes a heat dissipation film laminated to the lower surface, the first side surface, the second side surface, the third side surface and the fourth side surface for heat dissipation.

In a specific implementation, the display panel and the heat dissipation film may be aligned and laminated to each other by using the alignment mark regions.

In at least one embodiment of the present disclosure, the display device may further include an encapsulation cover plate. The encapsulation cover plate includes a first surface, and a fifth side surface, a sixth side surface, a seventh side surface, and an eighth side surface closely adjacent to the first surface separately. The fifth side surface, the sixth side surface, the seventh side surface and the eighth side surface are curved side surfaces. The first surface is laminated to the upper surface, the fifth side surface is laminated to the first side surface, the sixth side surface is laminated to the second side surface, the seventh side surface is laminated to the third side surface, and the eighth side surface is laminated to the fourth side surface.

In a specific implementation, the display panel and the encapsulation cover plate may be aligned and laminated to each other by using the alignment mark regions.

Optionally, the first surface may be a flat surface, the upper surface may be a surface for display of the display panel, and may be a flat surface.

Optionally, the encapsulation cover plate may be a glass cover plate, but the present disclosure is not limited thereto.

The display device according to at least one embodiment of the present disclosure may be any product or component having a display function, such as a mobile phone, a tablet computer, a television, a display, a notebook computer, a digital photo frame or a navigator.

A method for manufacturing a display device according to at least one embodiment of the present disclosure is used to manufacture the display device. The display device includes a display panel, a heat dissipation film and an encapsulation cover plate. The display panel includes a display region and a peripheral region arranged on a substrate. The peripheral region includes a region between the display region and an edge of the display panel, and includes a flat region and a curved region. The flat region includes a flat redundant driving circuit region. The method for manufacturing the display device may include: arranging a plurality of pixel units in the display region, and arranging a plurality of active driving circuits and a plurality of redundant driving circuits in the peripheral region; arranging at least part of the redundant driving circuits in the flat redundant driving circuit region, where each of the redundant driving circuits includes one or more electrode layers arranged on the substrate; arranging alignment mark regions in the flat redundant driving circuit region; in the alignment mark region, hollowing out at least one of the electrode layers, and/or filling up at least one of the electrode layers; and aligning and laminating the display panel and the encapsulation cover plate, and aligning and laminating the display panel and the heat dissipation film by using the alignment mark regions. A minimum distance between edges of orthographic projections of two adjacent alignment mark regions of the alignment mark regions onto the substrate is an alignment mark distance, and at least one alignment mark distance is larger than a predetermined alignment mark distance.

In at least one embodiment of the present disclosure, by using the alignment mark regions, the display panel and the encapsulation cover plate may be aligned and laminated to each other accurately, and the display panel and the heat dissipation film may be aligned and laminated to each other accurately.

Optionally, the predetermined alignment mark distance is 10 times of a maximum pixel edge length; the maximum pixel edge length is a maximum value among pixel edge lengths of the plurality of pixel units; and the pixel edge length of a pixel unit is a length of an edge of an orthographic projection of the pixel unit onto the substrate.

Optionally, an area of an orthographic projection of each of the alignment mark regions onto the substrate is larger than a predetermined area, and the predetermined area is a maximum pixel area. The maximum pixel area is a maximum value among pixel areas of the plurality of pixel units, and the pixel area of a pixel unit is an area of an orthographic projection of the pixel unit onto the substrate.

Unless otherwise defined, any technical or scientific term used herein shall have the common meaning understood by a person of ordinary skill in the art. Such words as "first" and "second" used in the specification and claims are merely used to differentiate different components rather than to represent any order, number or importance. Such words as "include" or "including" are intended to indicate that an element or object before the word contains an element or object or equivalents thereof listed after the word, without excluding any other element or object. Such words as "connect/connected to" or "couple/coupled to" may include electrical connection, whether direct or indirect, rather than to be limited to physical or mechanical connection. Such words as "upper", "lower", "left" and "right" are merely used to represent relative position relationship, and when an absolute position of the object is changed, the relative position relationship is also likely to change accordingly.

It should be appreciated that, when a component such as a layer, film, region or substrate is referred to as being located "above" or "below" another component, the component may be "directly" located "above" or "below" another component, or an intermediate component may exist.

In the description of the foregoing embodiments, specific features, structures, materials, or characteristics may be combined in a suitable manner in any one or more embodiments or examples.

The above descriptions merely describe preferred implementations of the present disclosure. It is appreciated, modifications and improvements may be made by a person of ordinary skill in the art without departing from the principle of the present disclosure, and these modifications and improvements shall be deemed as falling within the scope of the present disclosure.

What is claimed is:

1. A display panel, comprising: a display region and a peripheral region arranged on a substrate, wherein the display panel comprises a plurality of pixel units arranged in the display region, the peripheral region comprises a region between the display region and an edge of the display panel, and the display panel further comprises a plurality of active driving circuits and a plurality of redundant driving circuits arranged in the peripheral region; wherein, at least one of the plurality of active driving circuits is electrically connected to at least one of the plurality of pixel units to drive the pixel unit for display, and each of the redundant driving circuits comprises one or more electrode layers arranged on the substrate;

the peripheral region comprises a flat region and a curved region, wherein the curved region is a portion of the peripheral region that is bent toward a display surface of the display panel, and the flat region is an unbent portion of the peripheral region that is other than the curved region, wherein at least part of the plurality of redundant driving circuits is located in a flat redundant driving circuit region comprised in the flat region;

the flat redundant driving circuit region comprises at least two alignment marks;

in each of the alignment marks, at least one of the electrode layers is hollowed out, and/or at least one of the electrode layers is not provided with an opening;

a minimum distance between edges of orthographic projections of two adjacent alignment marks of the alignment marks onto the substrate is an alignment mark distance, and at least one alignment mark distance is larger than a predetermined alignment mark distance;

wherein the predetermined alignment mark distance is 10 times of a maximum pixel edge length;

the maximum pixel edge length is a maximum value among pixel edge lengths of the plurality of pixel units;

the pixel edge length of a pixel unit is a length of an edge of an orthographic projection of the pixel unit onto the substrate.

2. The display panel according to claim 1, wherein an area of an orthographic projection of each of the alignment marks onto the substrate is larger than a predetermined area;

the predetermined area is a maximum pixel area;

the maximum pixel area is a maximum value among pixel areas of the plurality of pixel units, and the pixel area of a pixel unit is an area of an orthographic projection of the pixel unit onto the substrate;

and/or, wherein the display panel comprises an upper surface, a lower surface, a first side surface, a second side surface, a third side surface and a fourth side surface;

both the upper surface and the lower surface are flat surfaces;

all the first side surface, the second side surface, the third side surface and the fourth side surface are curved side surfaces;

an orthographic projection of the first side surface onto a first plane does not overlap an orthographic projection of the flat region onto the first plane;

an orthographic projection of the second side surface onto the first plane does not overlap the orthographic projection of the flat region onto the first plane;

an orthographic projection of the third side surface onto the first plane does not overlap the orthographic projection of the flat region onto the first plane;

an orthographic projection of the fourth side surface onto the first plane does not overlap the orthographic projection of the flat region onto the first plane; and the first plane is parallel to the lower surface;

and/or, wherein an edge of an orthographic projection of each of the alignment marks onto the substrate is of a circular shape, a polygonal shape, an L shape or a T shape.

3. The display panel according to claim 1, wherein in each of the alignment marks, at least one of the electrode layers is not provided with an opening; in a first region, the electrode layers are hollowed out;

the first region is a region surrounding the alignment mark and comprised in the flat redundant driving circuit region.

4. The display panel according to claim 2, wherein the first side surface is a left side surface, the second side surface is a lower side surface, the third side surface is an upper side surface, and the fourth side surface is a right side surface; the display panel further comprises a circuit board arranged on the lower surface, and the circuit board is arranged at a lower side edge of the display panel;

a longest distance between an orthographic projection of each of the alignment marks onto the first plane and a lower left rounded corner of an orthographic projection of a display region boundary of the display panel onto the first plane is smaller than a predetermined distance, and/or, a longest distance between the orthographic projection of each of the alignment marks onto the first plane and a lower right rounded corner of the orthographic projection of the display region boundary of the display panel onto the first plane is smaller than the predetermined distance;

or, wherein the first side surface is a left side surface, the second side surface is a lower side surface, the third side surface is an upper side surface, and the fourth side surface is a right side surface; the display panel further comprises a circuit board arranged on the lower surface, and the circuit board is arranged at an upper side edge of the display panel;

a longest distance between an orthographic projection of each of the alignment marks onto the first plane and an upper left rounded corner of an orthographic projection of a display region boundary of the display panel onto the first plane is smaller than a predetermined distance, and/or, a longest distance between the orthographic projection of each of the alignment marks onto the first plane and an upper right rounded corner of the orthographic projection of the display region boundary of the display panel onto the first plane is smaller than the predetermined distance;

or, wherein the first side surface is a left side surface, the second side surface is a lower side surface, the third side surface is an upper side surface, and the fourth side surface is a right side surface; the display panel further comprises a circuit board arranged on the lower surface, and the circuit board is arranged at a lower side edge of the display panel;

a longest distance between an orthographic projection of each of the alignment marks onto the first plane and an upper left rounded corner of an orthographic projection of a display region boundary of the display panel onto the first plane is smaller than a predetermined distance, and/or, a longest distance between the orthographic projection of each of the alignment marks onto the first plane and an upper right rounded corner of the orthographic projection of the display region boundary of the display panel onto the first plane is smaller than the predetermined distance;

or, wherein the first side surface is a left side surface, the second side surface is a lower side surface, the third side surface is an upper side surface, and the fourth side surface is a right side surface; the display panel further comprises a circuit board arranged on the lower surface, and the circuit board is arranged at an upper side edge of the display panel;

a longest distance between an orthographic projection of each of the alignment marks onto the first plane and a lower left rounded corner of an orthographic projection of a display region boundary of the display panel onto the first plane is smaller than a predetermined distance, and/or, a longest distance between the orthographic projection of each of the alignment marks onto the first plane and a lower right rounded corner of the orthographic projection of the display region boundary of the display panel onto the first plane is smaller than the predetermined distance.

5. The display panel according to claim 1, wherein the display panel comprises a semiconductor layer, a gate metal layer and a source-drain metal layer sequentially arranged on the substrate;

in each of the alignment marks, both the gate metal layer and the source-drain metal layer are hollowed out.

6. The display panel according to claim 5, wherein in each of the alignment marks, the semiconductor layer is also hollowed out, or the semiconductor layer is not provided with an opening;

and/or, wherein the gate metal layer comprises a first gate metal layer and a second gate metal layer sequentially arranged on a surface of the semiconductor layer away from the substrate;

in each of the alignment marks, both the first gate metal layer and the second gate metal layer are hollowed out.

7. The display panel according to claim 5, wherein the display panel further comprises an anode layer arranged on a surface of the source-drain metal layer away from the gate metal layer;

in each of the alignment marks, the anode layer is not provided with an opening, and the anode layer is filled up;

or, wherein the display panel further comprises an anode layer arranged on a surface of the source-drain metal layer away from the gate metal layer;

in each of the alignment marks, the anode layer is hollowed out;

or, wherein the display panel further comprises an anode layer arranged on a surface of the source-drain metal layer away from the gate metal layer;

in each of the alignment marks, the anode layer comprises an alignment mark pattern.

8. The display panel according to claim 7, wherein, in a case that in each of the alignment marks, the anode layer is not provided with an opening, in a first region, the anode layer is hollowed out;

the first region is a region surrounding the alignment mark and comprised in the flat redundant driving circuit region;

and/or, in a region other than the alignment mark in a driving circuit zone, the anode layer is provided with a plurality of spaced openings.

9. The display panel according to claim 7, wherein in a case that in each of the alignment marks, the anode layer comprises an alignment mark pattern, an orthographic projection of the alignment mark pattern onto the substrate is of a circular shape, an L shape, a T shape or a polygonal shape.

10. The display panel according to claim 6, wherein, in a case that in each of the alignment marks, both the first gate metal layer and the second gate metal layer are hollowed out, in each of the alignment marks, the display panel further comprises an anode layer arranged on a surface of the source-drain metal layer away from the gate metal layer; the display panel further comprises a first insulation layer arranged between the semiconductor layer and the first gate metal layer, a second insulation layer arranged between the first gate metal layer and the second gate metal layer, a third insulation layer arranged between the second gate metal layer and the source-drain metal layer, and a fourth insulation layer arranged between the source-drain metal layer and the anode layer;

in each of the alignment marks, the first insulation layer, the second insulation layer, the third insulation layer and the fourth insulation layer are not hollowed out.

11. The display panel according to claim 1, wherein the peripheral region comprises a fan-out zone, a driving circuit zone and a signal line region sequentially arranged in a direction away from the display region;

the flat redundant driving circuit region is comprised in the driving circuit zone.

12. The display panel according to claim 11, wherein the redundant driving circuit comprises a plurality of stages of redundant shift register units, and the plurality of stages of redundant shift register units are not coupled to the plurality of pixel units.

13. The display panel according to claim 12, wherein at least one stage of the plurality of stages of redundant shift register units comprises the alignment marks, and the at least one stage of the plurality of stages of redundant shift register units is different from other redundant shift register units;

and/or, wherein, in each of the alignment marks, at least one film layer comprised in an output transistor of the redundant driving circuit is hollowed out;

and/or, wherein the redundant driving circuit comprises a redundant gate driving circuit and a redundant light-emission control circuit;

the redundant light-emission control circuit is arranged on a side of the redundant gate driving circuit away from the display region, and comprises a redundant light-emission control signal output line;

in each of the alignment marks, the redundant light-emission control signal output line is hollowed out;

and/or, wherein in a region other than the alignment marks comprised in the flat redundant driving circuit region, a first electrode plate of a storage capacitor is arranged;

in the region other than the alignment marks comprised in the flat redundant driving circuit region, a second electrode plate of the storage capacitor is not coupled to an output transistor comprised in the redundant driving circuit.

14. The display panel according to claim 11, wherein, each of the active driving circuits comprises a plurality of stages of shift register units;

the shift register units are coupled to corresponding rows of pixel units, and are configured to supply a gate driving signal and/or a light-emission control signal to the corresponding rows of pixel units.

15. A display device, comprising the display panel according to claim 1.

16. The display device according to claim 15, wherein the display panel comprises an upper surface, a lower surface, a first side surface, a second side surface, a third side surface and a fourth side surface; all the first side surface, the second side surface, the third side surface and the fourth side surface are curved side surfaces; an orthographic projection of the first side surface onto a first plane does not overlap an orthographic projection of the flat region onto the first plane; an orthographic projection of the second side surface onto the first plane does not overlap the orthographic projection of the flat region onto the first plane; an orthographic projection of the third side surface onto the first plane does not overlap the orthographic projection of the flat region onto the first plane; an orthographic projection of the fourth side surface onto the first plane does not overlap the orthographic projection of the flat region onto the first plane; and the first plane is parallel to the lower surface;

wherein the first side surface is a left side surface, the second side surface is a lower side surface, the third side surface is an upper side surface, and the fourth side surface is a right side surface; the display panel further comprises a circuit board arranged on the lower surface, and the circuit board is arranged at a lower side edge or an upper side edge of the display panel;

the display device further comprises a heat dissipation film laminated to the lower surface, the first side surface, the second side surface, the third side surface and the fourth side surface.

17. The display device according to claim 16, further comprising an encapsulation cover plate;

wherein the encapsulation cover plate comprises a first surface, and a fifth side surface, a sixth side surface, a seventh side surface and an eighth side surface closely adjacent to the first surface separately;

all the fifth side surface, the sixth side surface, the seventh side surface and the eighth side surface are curved side surfaces;

the first surface is laminated to the upper surface, the fifth side surface is laminated to the first side surface, the sixth side surface is laminated to the second side surface, the seventh side surface is laminated to the third side surface, and the eighth side surface is laminated to the fourth side surface.

18. A method for manufacturing a display panel, wherein the display panel comprises a display region and a peripheral region arranged on a substrate, the peripheral region comprises a region between the display region and an edge of the display panel, the peripheral region comprises a flat region and a curved region, wherein the curved region is a portion of the peripheral region that is bent toward a display surface of the display panel, and the flat region is an unbent portion of the peripheral region that is other than the curved region, and the flat region comprises a flat redundant driving circuit region;

the method for manufacturing the display panel comprises:

arranging a plurality of pixel units in the display region, and arranging a plurality of active driving circuits and a plurality of redundant driving circuits in the peripheral region;

arranging at least part of the redundant driving circuits in the flat redundant driving circuit region, wherein each of the redundant driving circuits comprises one or more electrode layers arranged on the substrate;

arranging alignment marks in the flat redundant driving circuit region; and in each of the alignment marks, hollowing out at least one of the electrode layers, and/or not providing an opening in at least one of the electrode layers; wherein a minimum distance between edges of orthographic projections of two adjacent alignment marks of the alignment marks onto the substrate is an alignment mark distance, and at least one alignment mark distance is larger than a predetermined alignment mark distance;

wherein the predetermined alignment mark distance is 10 times of a maximum pixel edge length;

the maximum pixel edge length is a maximum value among pixel edge lengths of the plurality of pixel units;

the pixel edge length of a pixel unit is a length of an edge of an orthographic projection of the pixel unit onto the substrate.

19. A method for manufacturing a display device, wherein the display device comprises a display panel, a heat dissipation film and an encapsulation cover plate, the display panel comprises a display region and a peripheral region arranged on a substrate, the peripheral region comprises a region between the display region and an edge of the display panel, the peripheral region comprises a flat region and a curved region, wherein the curved region is a portion of the peripheral region that is bent toward a display surface of the display panel, and the flat region is an unbent portion of the peripheral region that is other than the curved region, and the flat region comprises a flat redundant driving circuit region;

the method for manufacturing the display device comprises:

arranging a plurality of pixel units in the display region, and arranging a plurality of active driving circuits and a plurality of redundant driving circuits in the peripheral region;

arranging at least part of the redundant driving circuits in the flat redundant driving circuit region, wherein each of the redundant driving circuits comprises one or more electrode layers arranged on the substrate;

arranging alignment marks in the flat redundant driving circuit region;

in each of the alignment marks, hollowing out at least one of the electrode layers, and/or not providing an opening in at least one of the electrode layers; and aligning and laminating the display panel with the encapsulation cover plate, and aligning and laminating the display panel with the heat dissipation film by using the alignment marks;

wherein a minimum distance between edges of orthographic projections of two adjacent alignment marks of the alignment marks onto the substrate is an alignment mark distance, and at least one alignment mark distance is larger than a predetermined alignment mark distance;

wherein the predetermined alignment mark distance is 10 times of a maximum pixel edge length;

the maximum pixel edge length is a maximum value among pixel edge lengths of the plurality of pixel units;

the pixel edge length of a pixel unit is a length of an edge of an orthographic projection of the pixel unit onto the substrate.

* * * * *